(12) United States Patent
Okita et al.

(10) Patent No.: US 9,941,132 B2
(45) Date of Patent: Apr. 10, 2018

(54) PLASMA PROCESSING APPARATUS AND PLASMA PROCESSING METHOD

(71) Applicant: Panasonic Intellectual Property Management Co., Ltd., Osaka (JP)

(72) Inventors: Shogo Okita, Hyogo (JP); Atsushi Harikai, Osaka (JP); Noriyuki Matsubara, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 200 days.

(21) Appl. No.: 15/000,789

(22) Filed: Jan. 19, 2016

(65) Prior Publication Data

US 2016/0293456 A1 Oct. 6, 2016

(30) Foreign Application Priority Data

Mar. 31, 2015 (JP) ................................ 2015-073602
Mar. 31, 2015 (JP) ................................ 2015-073782

(51) Int. Cl.
*H01L 21/302* (2006.01)
*H01L 21/3065* (2006.01)
(Continued)

(52) U.S. Cl.
CPC .... *H01L 21/3065* (2013.01); *H01J 37/32568* (2013.01); *H01J 37/32697* (2013.01); *H01J 37/32715* (2013.01); *H01J 37/32724* (2013.01); *H01L 21/67109* (2013.01); *H01L 21/6833* (2013.01); *H01L 21/6836* (2013.01); *H01L 21/68742* (2013.01); *H01L 21/78* (2013.01); *H01L 2221/68327* (2013.01)

(58) Field of Classification Search
CPC .......... H01L 21/6833; H01L 21/68742; H01L 21/6875; H01J 37/32009
USPC ................................ 438/715, 716, 729, 731
See application file for complete search history.

(56) References Cited

U.S. PATENT DOCUMENTS 8,206,551 B2 * 6/2012 Bluck ............... H01L 21/67161
                                                                118/719
2002/0002950 A1 * 1/2002 Tsuchihashi ........ C23C 16/4586
                                                                118/724
(Continued)

FOREIGN PATENT DOCUMENTS

JP          2009-094436 A      4/2009

*Primary Examiner* — Binh X Tran
(74) *Attorney, Agent, or Firm* — Pearne & Gordon LLP

(57) ABSTRACT

A plasma processing apparatus includes: a reaction chamber; a plasma generation unit; a stage disposed inside the reaction chamber; an electrostatic chuck mechanism including an electrode portion inside the stage; a heater inside the stage; a support portion which supports a conveyance carrier between a stage-mounted position on the stage and a transfer position distant from the stage upward; and an elevation mechanism which elevates and lowers the support portion relative to the stage. In a case in which the conveyance carrier is mounted on the stage by lowering the support portion, application of voltage to the electrode portion is started in a state that the stage is being heated, and the plasma generation unit generates plasma after at least a part of an outer circumferential portion of a holding sheet holding the conveyance carrier contacts the stage and also after the heating of the stage is stopped.

7 Claims, 12 Drawing Sheets

(51) Int. Cl.
*H01L 21/78* (2006.01)
*H01J 37/32* (2006.01)
*H01L 21/67* (2006.01)
*H01L 21/683* (2006.01)
*H01L 21/687* (2006.01)

(56) References Cited

U.S. PATENT DOCUMENTS

| | | | |
|---|---|---|---|
| 2010/0216313 A1 | 8/2010 | Iwai | |
| 2010/0243609 A1* | 9/2010 | Yamazawa | H01J 37/32091 216/71 |
| 2012/0238073 A1* | 9/2012 | Johnson | H01L 21/3065 438/464 |
| 2014/0242780 A1* | 8/2014 | Gauldin | H01L 21/3065 438/463 |
| 2016/0145742 A1* | 5/2016 | Janakiraman | C23C 16/45565 118/728 |
| 2016/0237565 A1* | 8/2016 | Sieber | H01L 21/6838 |

* cited by examiner

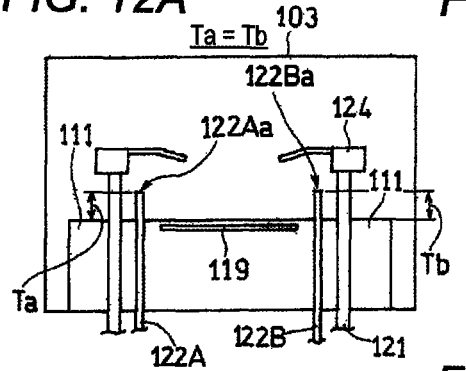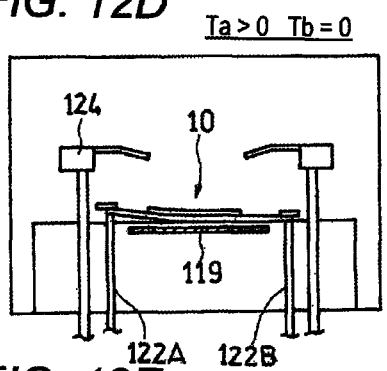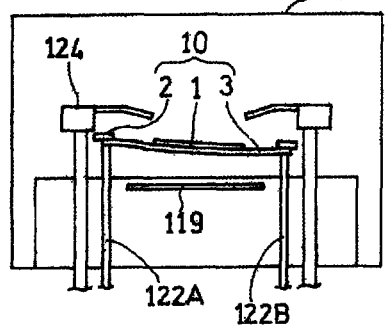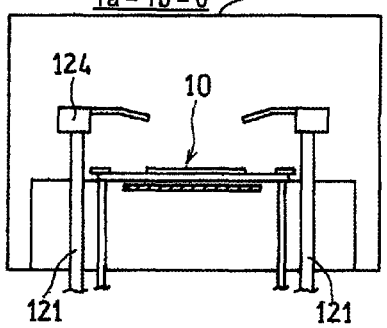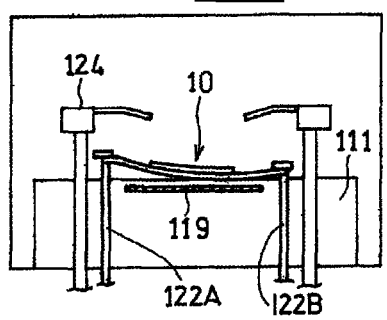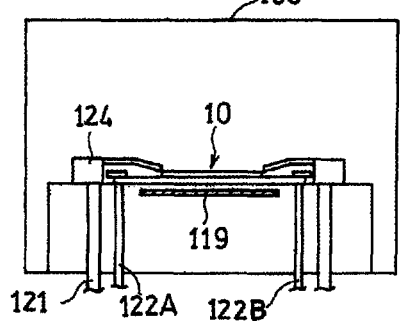

PLASMA PROCESSING APPARATUS AND PLASMA PROCESSING METHOD

CROSS-REFERENCE TO RELATED APPLICATION(S)

This application is based on and claims priority from Japanese Patent Application No. 2015-073602 filed on Mar. 31, 2015 and Japanese Patent Application No. 2015-073782 filed on Mar. 31, 2015, the entire contents of which are incorporated herein by reference.

BACKGROUND

1. Field of the Invention

One or more embodiments of the present invention relate to a plasma processing apparatus and a plasma processing method. More particularly, one or more embodiments of the invention relate to a plasma processing apparatus and a plasma processing method for processing a substrate that is held by a conveyance carrier.

2. Description of Related Art

Among various methods for dicing a substrate is plasma dicing which performs plasma etching on a substrate on which a resist mask is formed and thereby divides it into individual chips. JP-A-2009-94436 discloses performing plasma processing on a substrate that is mounted on a plasma processing stage (hereinafter referred to simply as a stage) in such a manner as to be bonded to a conveyance carrier having a frame and a holding sheet that covers an opening of the frame, to improve substrate handling performance during conveyance etc.

SUMMARY

Where plasma processing is performed on a substrate that is mounted being held by a conveyance carrier, usually the conveyance carrier is absorbed on the stage by means of an electrostatic chuck mechanism called an electrostatic chuck. The electrostatic chuck mechanism applies a voltage to an electrostatic chuck electrode (hereinafter referred to as an ESC electrode) disposed inside the stage and causes the conveyance carrier to be absorbed on the stage by Coulomb force or Johnsen-Rahbek force that acts between the ESC electrode and the conveyance carrier. The stage is being cooled. By performing plasma processing in a state that the conveyance carrier is absorbed on the stage being cooled, the conveyance carrier being subjected to plasma processing can be cooled effectively.

In recent years, with the miniaturization and thickness reduction of electronic devices, IC chips etc. that are incorporated in electronic devices have been reduced in thickness. And substrates on which IC chips etc. as dicing targets are to be formed have been reduced in thickness accordingly and hence are prone to warp.

Holding sheets for holding a substrate are also thin and hence prone to warp. Therefore, there may occur an event that a conveyance carrier that holds a substrate is mounted on a stage with the holding sheet wrinkled. The holding sheet is not unwrinkled even if the conveyance carrier is absorbed on the stage by means of an electrostatic chuck mechanism. If plasma processing is performed in a state that the holding sheet is kept wrinkled, abnormal discharge or temperature increase may occur at wrinkles to disable normal plasma processing.

One aspect of the invention includes a plasma processing apparatus for performing plasma processing on a substrate that is held by a conveyance carrier including a holding sheet that holds the substrate and a frame that is attached to an outer circumferential portion of the holding sheet. The plasma processing apparatus includes: a reaction chamber; a plasma generation unit which generates plasma in the reaction chamber; a stage which is disposed inside the reaction chamber and on which the conveyance carrier is mountable; an electrostatic chuck mechanism including an electrode portion that is disposed inside the stage; a heater disposed inside the stage; a support portion which supports the conveyance carrier between a stage-mounted position on the stage and a transfer position that is distant from the stage upward; and an elevation mechanism which elevates and lowers the support portion relative to the stage. In a case in which the conveyance carrier is mounted on the stage by lowering the support portion, the electrostatic chuck mechanism starts applying a voltage to the electrode portion in a state that the stage is being heated by the heater, and the plasma generation unit generates plasma after at least a part of the outer circumferential portion of the holding sheet contacts the stage and also after the heating of the stage by the heater is stopped.

Another aspect of the invention includes a plasma processing apparatus for performing plasma processing on a substrate that is held by a conveyance carrier including a holding sheet that holds the substrate and a frame that is attached to an outer circumferential portion of the holding sheet. The plasma processing apparatus includes: a reaction chamber; a plasma generation unit which generates plasma in the reaction chamber; a stage which is disposed inside the reaction chamber and on which the conveyance carrier is mountable; an electrostatic chuck mechanism including an electrode portion that is disposed inside the stage; a heater disposed inside the stage; a support portion which supports the conveyance carrier between a stage-mounted position on the stage and a transfer position that is distant from the stage upward; and an elevation mechanism which elevates and lowers the support portion relative to the stage. In a case in which the conveyance carrier is separated from the stage by elevating the support portion in a state that voltage application to the electrode portion is stopped, the elevation mechanism elevates the support portion after a start of heating of the stage by the heater.

Yet another aspect of the invention includes a plasma processing method for performing plasma processing on a substrate that is held by a conveyance carrier that is mounted on a stage that is disposed in a reaction chamber. The conveyance carrier includes a holding sheet that holds the substrate and a frame that is attached to an outer circumferential portion of the holding sheet, and the stage includes therein an electrode portion of an electrostatic chuck mechanism and a heater. The plasma processing method includes: causing a support portion, which is capable of being elevated and lowered relative to the stage, to support the conveyance carrier at a transfer position that is distant from the stage upward; mounting the conveyance carrier to a stage-mounted position on the stage by lowering the support portion; applying a voltage to the electrode portion; heating the stage by a heater; and generating plasma in the reaction chamber. The voltage application to the electrode portion is started in a state that the stage is being heated, and the plasma is generated after at least a part of the outer circumferential portion of the holding sheet contacts the stage and also after the heating of the stage is stopped.

Yet another aspect of the invention includes a plasma processing method for performing plasma processing on a substrate that is held by a conveyance carrier that is mounted on a stage that is disposed in a reaction chamber. The conveyance carrier includes a holding sheet that holds the substrate and a frame that is attached to an outer circumferential portion of the holding sheet, and the stage includes therein an electrode portion of an electrostatic chuck mechanism and a heater. The plasma processing method includes: stopping application of a voltage that has been applied to the electrode portion; heating the stage by the heater; causing a support portion, which is capable of being elevated and lowered relative to the stage, to support the conveyance carrier at a stage-mounted position on the stage; and separating the conveyance carrier from the stage by elevating the support portion after the application of the voltage is stopped. The support portion is elevated after a start of the heating of the stage.

Yet another aspect of the invention includes a plasma processing apparatus for performing plasma processing on a substrate that is held by a conveyance carrier including a holding sheet that holds the substrate and a frame that is attached to an outer circumferential portion of the holding sheet. The plasma processing apparatus includes: a reaction chamber; a stage which is disposed inside the reaction chamber and on which the conveyance carrier is mountable; an electrostatic chuck mechanism including an electrode portion that is disposed inside the stage; a support portion which supports the conveyance carrier between a stage-mounted position on the stage and a transfer position that is distant from the stage upward; and an elevation mechanism which elevates and lowers the support portion relative to the stage. In a case in which the conveyance carrier is mounted on the stage by lowering the support portion, the support portion supports the conveyance carrier so that the holding sheet comes into contact with the stage in a state that the frame is inclined with respect to the stage.

Yet another aspect of the invention includes a plasma processing apparatus for performing plasma processing on a substrate that is held by a conveyance carrier including a holding sheet that holds the substrate and a frame that is attached to an outer circumferential portion of the holding sheet. The plasma processing apparatus includes: a reaction chamber; a plasma generation unit which generates plasma in the reaction chamber; a stage which is disposed inside the reaction chamber and on which the conveyance carrier is mountable; an electrostatic chuck mechanism including an electrode portion that is disposed inside the stage; a support portion which supports the conveyance carrier between a stage-mounted position on the stage and a transfer position that is distant from the stage upward; and an elevation mechanism which elevates and lowers the support portion relative to the stage. In a case in which the conveyance carrier is separated from the stage by elevating the support portion, the support portion supports the conveyance carrier so that the conveyance carrier is separated from the stage in a state that the frame is inclined with respect to the stage.

Yet another aspect of the invention includes a plasma processing method for performing plasma processing on a substrate that is held by a conveyance carrier that is mounted on a stage that is disposed in a reaction chamber, the conveyance carrier including a holding sheet that holds the substrate and a frame that is attached to an outer circumferential portion of the holding sheet. The plasma processing method includes: causing a support portion, which is capable of being elevated and lowered relative to the stage, to support the conveyance carrier at a transfer position that is distant from the stage upward; mounting the conveyance carrier to a stage-mounted position on the stage by lowering the support portion; and applying a voltage to an electrode portion of an electrostatic chuck mechanism that is disposed inside the stage. The support portion is lowered so that the holding sheet comes into contact with the stage in a state that the frame is inclined with respect to the stage.

Yet another aspect of the invention includes a plasma processing method for performing plasma processing on a substrate that is held by a conveyance carrier that is mounted on a stage that is disposed in a reaction chamber. The conveyance carrier includes a holding sheet that holds the substrate and a frame that is attached to an outer circumferential portion of the holding sheet. The plasma processing method includes: causing a support portion capable of being elevated and lowered relative to the stage to support, at a stage-mounted position, the conveyance carrier being mounted on the stage; and separating the conveyance carrier from the stage in a state that the frame is inclined with respect to the stage by elevating the support portion.

Owing to one or more embodiments of the invention, it is possible to increase the yield of products of plasma processing that is performed on a substrate that is held by a conveyance carrier.

BRIEF DESCRIPTION OF THE DRAWINGS

FIGS. 7A and 7B are conceptual graphs in which the horizontal axis represents the time from a start of input of power to an antenna from a first radio-frequency power source and the vertical axis represents the voltage that is applied to each ESC electrode, and FIG. 7C is a conceptual graph in which the horizontal axis is the same as that of each of FIGS. 7A and 7B and the vertical axis represents the power that is input to the antenna.

FIGS. 12A to 12F are conceptual diagrams showing an operation of the plasma processing apparatus according to the third embodiment.

DETAILED DESCRIPTION

Figure 1A:
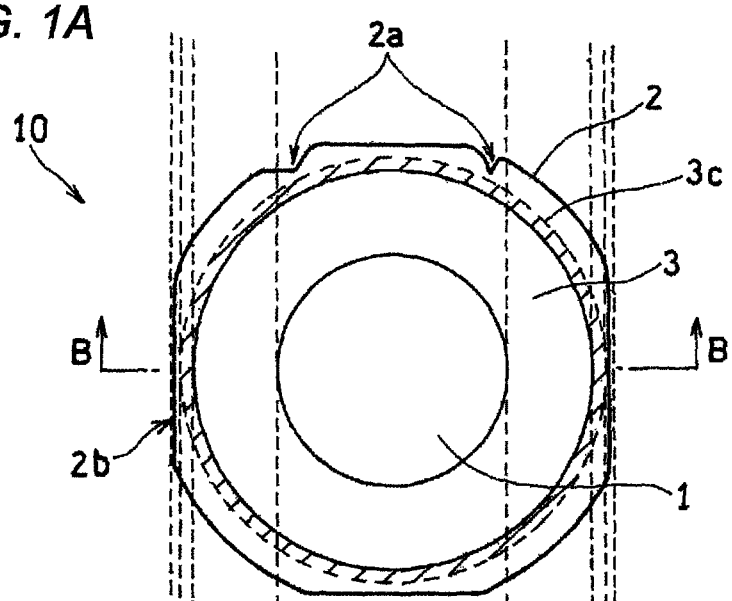
FIG. 1A is a schematic top view of a conveyance carrier used in embodiments of the present invention which holds a substrate.
Figure 1B:
FIG. 1B is a sectional view taken along line B-B in FIG. 1A.

Embodiments of the present invention will be hereinafter described in detail with reference to the drawings. FIG. 1A is a schematic top view of a conveyance carrier 10 used in the embodiments, and FIG. 1B is a sectional view, taken along line B-B in FIG. 1A, of the conveyance carrier 10 in a no load state. Although a frame 2 and a substrate 1 are circular in FIGS. 1A and 1B, the invention is not limited to such a case.

As shown in FIG. 1A, the conveyance carrier 10 is equipped with the frame 2 and a holding sheet 3 that holds the substrate 1. An outer circumferential portion 3c of the holding sheet 3 is fixed to the frame 2. The substrate 1 is bonded to the holding sheet 3 and thereby held by the conveyance carrier 10. The outer circumferential portion 3c occupies an overlap region between the holding sheet 3 and the frame 2. In FIGS. 1A and 1B, the outer circumferential portion 3c is hatched just for the sake of convenience.

The substrate 1 is a processing object of plasma processing such as plasma dicing. The substrate 1 is produced by forming a circuit layer of semiconductor circuits, electronic components, MEMS devices, etc. on one surface of a substrate body (made of Si, GaAs, SiC, or the like) and decreasing its thickness by grinding the back side, opposite to the circuit layer, of the substrate body. Usually, the substrate 1 is as very thin as about 25 to 150 μm and hence has almost no self-supportiveness (rigidity) in itself. As the substrate 1 becomes thinner, it becomes more prone to warp or bend due to an internal stress difference between the circuit layer and the substrate body. When the substrate 1 warps or bends, it becomes difficult to, for example, convey or cool the substrate 1 in performing plasma processing on it.

In view of the above, the outer circumferential portion 3c of the holding sheet 3 is fixed to the frame 2 which is approximately flat in such a state that the holding sheet 3 is under tension and the substrate 1 is bonded to the holding sheet 3. The holding sheet 3 is a resin sheet of about 50 to 150 μm in thickness and is rigid enough to be able to hold the substrate 1. One surface of the holding sheet 3 is formed with an adhesive layer and the substrate 1 is bonded to the adhesive layer. In this manner, in the conveyance carrier 10, the substrate 1, the holding sheet 3, and the frame 2 can be set approximately in the same plane. This facilitates handling of the substrate 1 such as its conveyance and its cooling during the plasma processing in performing plasma processing on it.

However, where the substrate 1 is bonded to the holding sheet 3 whose outer circumferential portion 3c is fixed to the frame 2, the holding sheet 3 may warp as shown in FIG. 1B. In FIG. 1B, the warp is exaggerated to facilitate understanding.

Four possible causes of a warp of the holding sheet 3 will be described below.

The first cause is of a case that the holding sheet 3 warps due to distortion of the frame 2. Although the frame 2 is designed so as to be flat, it may be rendered low in flatness due to variations in manufacture, allowances of manufacture, repeated use in manufacture, and other factors. If the frame 2 used is low in flatness, the holding sheet 3 warps that is fixed to the frame 2.

The second cause is of a case that the holding sheet 3 warps due to the shape of the substrate 1. The conveyance carrier 10 holds the substrate 1 so that it is kept approximately flat because the holding sheet 3 is under tension. However, for example, where the substrate 1 has a cut such as orientation flat, tension does not act on the substrate 1 uniformly from the holding sheet 3. In this case, a portion of the holding sheet 3 around the orientation flat is wrinkled to cause the holding sheet 3 to warp.

The third cause is of a case that the holding sheet 3 warps due to gravity. The conveyance carrier 10 holds the substrate 1 so that it is kept approximately flat because the holding sheet 3 is under tension. However, the holding sheet 3 elongates or the frame 2 is distorted due to the weights of the substrate 1 and the holding sheet 3 themselves, to cause a warp of the holding sheet 3.

The fourth cause is of a case that the holding sheet 3 warps due to stress that acts on the substrate 1. The substrate 1 receives stress that causes it to warp. On the other hand, the adhesion of the bonding of the substrate 1 to the holding sheet 3 and the tension that is exerted from the holding sheet 3 to the substrate 1 act against the stress on the substrate 1 and suppress the warp of the substrate 1 to keep it approximately flat. However, if the stress acting on the substrate 1 is too strong, the holding sheet 3 cannot suppress the warp of the substrate 1 sufficiently, as a result of which the holding sheet 3 expands and warps.

The electrostatic chuck electrode(s) (ESC electrode(s)) is generally classified into two types, that is, a single polarity type and a double polarity type. When a voltage is applied to the ESC electrode, absorption force acts between the ESC electrode and the holding sheet 3, whereby the conveyance carrier 10 can be absorbed on a stage 111.

The single-polarity ESC electrode consists of at least one electrode and a voltage of a fixed polarity is applied to all the electrodes. An electrostatic chuck mechanism having a single-polarity ESC electrode has an absorption mechanism that utilizes Coulomb force. By applying a voltage to the ESC electrode, charge is induced in the surface of the stage 111 by dielectric polarization and the conveyance carrier 10 that is placed on the stage 111 is charged. As a result, Coulomb force acts between the charge induced in the surface of the stage 111 and the conveyance carrier 10 that is charged, whereby the conveyance carrier 10 is absorbed on the stage 111. The conveyance carrier 10 may be charged by generating plasma in a reaction chamber 103 and having the conveyance carrier 10 exposed to the plasma.

Figure 3:
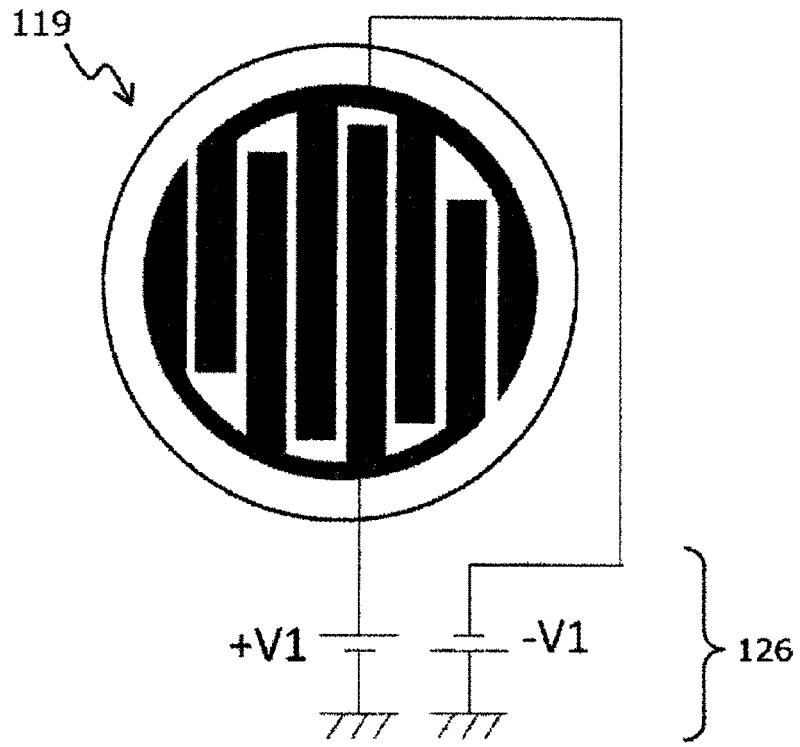
FIG. 3 is a conceptual diagram showing a relationship between ESC electrodes and a DC power source in the embodiments.

On the other hand, the double-polarity ESC electrodes have a positive electrode and a negative electrode to which voltages of different polarities are applied, respectively. Comb electrodes 119 shown in FIG. 3 are an example of the double-polarity ESC electrodes. As shown in FIG. 3, voltages V1 and −V1 are applied to the positive electrode and the negative electrode, respectively.

The absorption mechanism of the electrostatic chuck mechanism that is equipped with the double-polarity ESC electrodes is classified into one that utilizes Coulomb force and one that utilizes Johnsen-Rahbek force. A proper electrode structure and material (e.g., ceramic) are selected according to the absorption mechanism. In either absorption mechanism, voltages of different polarities are applied to the positive electrode and the negative electrode, whereby absorption force acts between the ESC electrodes and the conveyance carrier 10 and the conveyance carrier 10 can be absorbed on the stage 111. With the double-polarity ESC electrodes, unlike with the single-polarity ESC electrode, it is not necessary to charge the conveyance carrier 10 to have it absorbed.

It is possible to cause the double-polarity ESC electrodes to function as single-polarity ESC electrodes by employing a proper method for applying voltages to the positive electrode and the negative electrode, more specifically, by applying voltages of the same polarity to the positive electrode and the negative electrode. In the following description, a mode in which voltages of different polarities are applied to the positive electrode and the negative electrode of the double-polarity ESC electrodes is called a double-polarity mode, and a mode in which voltages of the same polarity are applied to the positive electrode and the negative electrode is called a single-polarity mode.

In the single-polarity mode, voltages of the same polarity are applied to the positive electrode and the negative electrode and an absorption mechanism that utilizes Coulomb force is employed. Unlike in the double-polarity mode, the conveyance carrier 10 cannot be absorbed merely by applying voltages to the positive electrode and the negative electrode. In the single-polarity mode, to have the conveyance carrier 10 absorbed, it is necessary to charge the conveyance carrier 10. To this end, plasma is generated in the reaction chamber 103 and the conveyance carrier 10 is exposed to the plasma. As a result, the conveyance carrier 10 is charged and thereby absorbed on the stage 111.

The single-polarity ESC electrode and the double-polarity ESC electrodes have been described above. In either case, it is possible to have the conveyance carrier 10 absorbed on the stage 111.

As described above, when a conveyance carrier 10 having a warped holding sheet 3 is mounted on the stage 111, the holding sheet 3 or the substrate 1 itself may be wrinkled. Such wrinkles may develop in either a region of the holding sheet 3 where it is not in contact with the substrate 1 or a region of the holding sheet 3 where it is in contact with the substrate 1. In the latter case, the substrate 1 itself that is bonded to the holding sheet 3 may be wrinkled.

Usually, to prevent the conveyance carrier 10 from being heated by plasma irradiation and thereby damaged thermally, the stage 111 is cooled to, for example, 15° C. or less. By cooling the stage 111, the conveyance carrier 10 that is mounted on the stage 111 is also cooled and is suppressed in thermal damage.

However, the holding sheet 3 may shrink when it is brought in contact with the cooled stage 111. This phenomenon is remarkable in the case where the holding sheet 3 is made of a thermoplastic resin material such as polyolefin. In this case, the holding sheet 3 shrinks when cooled and expands when heated. Since the outer circumferential portion 3c of the holding sheet 3 is fixed to the frame 2, shrinkage of the holding sheet 3 is a cause of wrinkling of the holding sheet 3.

When a wrinkled conveyance carrier 10 is mounted on the stage 111 by the electrostatic chuck mechanism, at least a part of the wrinkles of the holding sheet 3 cannot come into contact with the stage 111 and the holding sheet 3 is absorbed on the stage 111 in such a manner that portions of the holding sheet 3 are elevated from the stage 111. If plasma processing is performed in a state such elevated portions occur in the region of the holding sheet 3 where it is in contact with the substrate 1, the degree of etching is made different between the elevated portions and the other portions to cause variations in processing result shapes or unprocessed portions. Furthermore, irrespective of where elevated portions are formed, local temperature increase or abnormal discharge may occur in the elevate portions. Such temperature increase or abnormal discharge may damage the substrate 1, the holding sheet 3, or the ESC electrode(s).

Still further, in a picking-up step which is executed after the plasma processing, wrinkling of the holding sheet 3 makes it difficult to recognize chips correctly, possibly resulting in pickup errors. In a subsequent appearance inspection step, trouble may occur that good products cannot be discriminated correctly from defective ones.

In first and second embodiments of the invention, in mounting the conveyance carrier 10 on the stage 111, application of a voltage(s) to the ESC electrode(s) is started after the stage 111 is heated, whereby the holding sheet 3 is absorbed on the stage 111 in a state that the holding sheet 3 is not wrinkled.

The first to fourth cases have been described above as the four possible causes of a warp of the holding sheet 3. The first and second embodiments are particularly useful for the first and second cases. Where the frame 2 is distorted as in the first case, it may become difficult to bring the holding sheet 3 into close contact with the stage 111 when the holding sheet 3 under tension is fixed to the frame 2. If the conveyance carrier 10 is absorbed after the stage 111 has been heated, the holding sheet 3 is softened and thereby expanded. This makes it possible to bring the holding sheet 3 into close contact with the stage 111 and prevent the holding sheet 3 from being wrinkled or elevated partially.

Where the holding sheet 3 warps due to the shape of the substrate 1 as in the second case, the tension distribution of the holding sheet 3 becomes non-uniform. As a result, the holding sheet 3 may be wrinkled to cause difficulty bringing itself into close contact with the stage 111. Also in this case, if the conveyance carrier 10 is absorbed after the stage 111 has been heated, the holding sheet 3 is softened and thereby expanded. This makes it possible to bring the holding sheet 3 into close contact with the stage 111 and prevent the holding sheet 3 from being wrinkled or elevated partially.

In the first and second embodiments, the conveyance carrier 10 is separated from the stage 111 after the stage 111 is heated. Since the surface of the stage 111 has been heated, the tension of the holding sheet 3 is reduced, which allows the holding sheet 3 to be separated from the stage 111 smoothly. Since the surface of the stage 111 has been heated, shrinkage of the holding sheet 3 is removed. This makes it possible to suppress damaging of individual chips due to contact between adjoining chips.

In a third embodiment of the invention, in mounting the conveyance carrier 10 on the stage 111, a support portion 122 is lowered in such a manner that the frame 2 is kept inclined with respect to the stage 111, whereby the holding sheet 3 is absorbed on the stage 111 in a state that the holding sheet 3 is not wrinkled. Furthermore, in a fourth embodiment of the invention, in separating the conveyance carrier 10 from the stage 111, the support portion 122 is elevated in such a manner that the frame 2 is kept inclined with respect to the stage 111, whereby the holding sheet 3 is removed from the stage 111 in a state that the holding sheet 3 is not wrinkled.

(Plasma Processing Apparatus)

Figure 2:
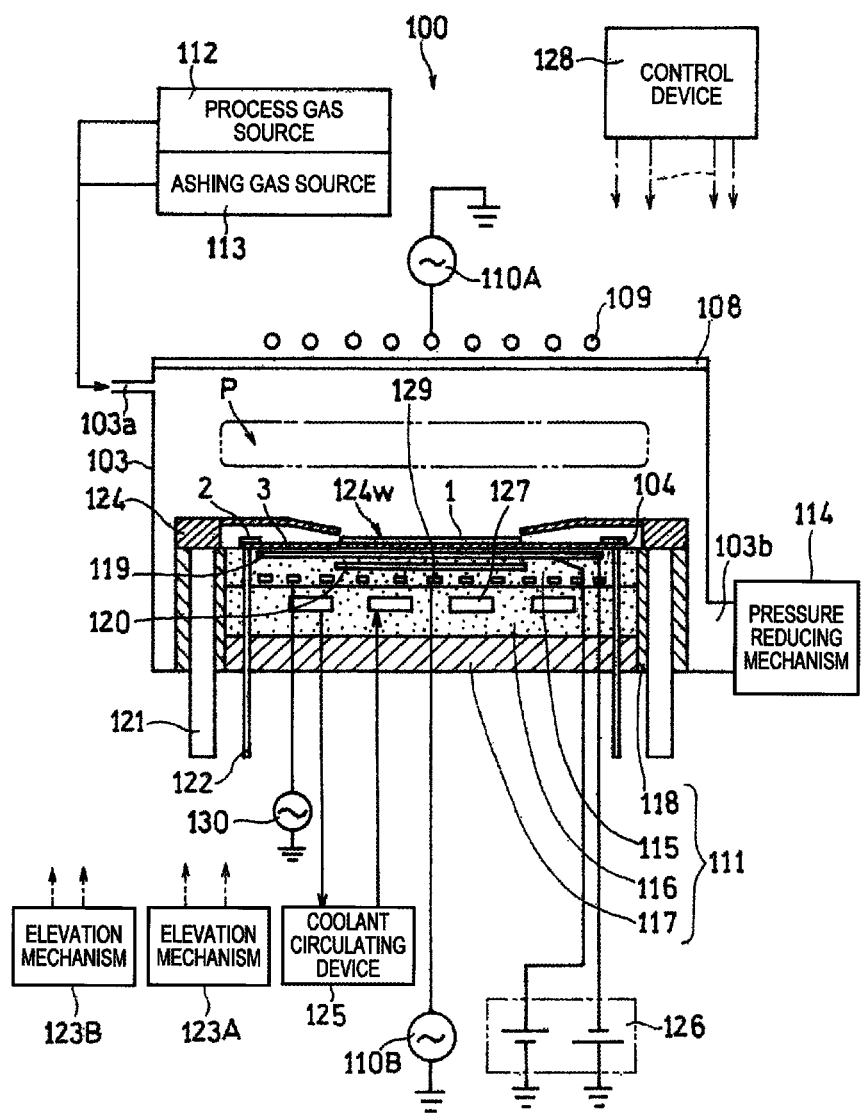
FIG. 2 is a conceptual diagram of a plasma processing apparatus according to the embodiments.

First, a plasma processing apparatus 100 according to the embodiments of the invention will be described with reference to FIG. 2. FIG. 2 is a schematic sectional view of the plasma processing apparatus 100 according to the embodiments of the invention.

The plasma processing apparatus 100 is equipped with the stage 111. The conveyance carrier 10 is mounted on the stage 111 in such a manner that the surface (adherent surface 3a) that holds a substrate 1 is up. A cover 124 which covers the frame 2 and at least a part of the holding sheet 3 and has a window 124W for exposing at least a part of the substrate 1 is disposed over the stage 111.

The stage 111 and the cover 124 are disposed in the reaction chamber (vacuum chamber) 103. The top of the vacuum chamber 103 is closed by a dielectric member 108, and an antenna 109 as a top electrode is disposed over the dielectric member 108. The antenna 109 is electrically connected to a first radio-frequency power source 110A. The stage 111 is disposed at the bottom of the reaction chamber 103.

A gas inlet 103a is connected to the vacuum chamber 103. A process gas source 112 which is a source of a plasma generation gas and an ashing gas source 113 are connected to the gas inlet 103a via respective pipes. The vacuum chamber 103 has an exhaust outlet 103b, and a pressure reducing mechanism 114 which includes a vacuum pump and serves to reduce the pressure in the vacuum chamber 103 by exhausting gas inside it is connected to the exhaust outlet 103b. A plasma generation unit consists of the antenna 109, the process gas source 112, and the first radio-frequency power source 110A.

The stage 111 is equipped with an approximately circular electrode layer 115 and metal layer 116, a base stage 117 which supports the electrode layer 115 and the metal layer 116, and an outer circumference portion 118 which surrounds the electrode layer 115, the metal layer 116, and the base stage 117. Disposed inside the electrode layer 115 are electrode(s) (hereinafter referred to as an ESC electrode(s)) 119 which is part of the electrostatic chuck mechanism, a radio-frequency electrode member 120 which is electrically connected to a second radio-frequency power source 110B, and a heater 129 which is electrically connected to an AC power source 130.

The electrode layer 115, that is, a surface-side portion of the stage 111, is mainly heated by the heater 129. A DC power source 126 is electrically connected to the ESC electrode 119. The electrostatic chuck mechanism consists of the ESC electrode 119 and the DC power source 126. In the third and fourth embodiments, the stage 111 need not always be equipped with the heater 129.

For example, the metal layer 116 is an aluminum layer having a surface alumite coating. A coolant passage 127 is formed inside the metal layer 116 and serves to cool the stage 111. When the stage 111 is cooled, the conveyance carrier 10 that is mounted on the stage 111 is cooled and the cover 124 part of which is in contact with the stage 111 is also cooled. Coolant is circulated along the coolant passage 127 by a coolant circulating device 125.

Plural support portion 122 is disposed so as to penetrate through the stage 111 at positions near its outer circumference, and is driven, that is, elevated or lowered, by an elevation mechanism 123A. When the top surface of the support portion 122 is located at a transfer position that is distant from the stage 111 upward, a conveyance carrier 10 is conveyed into the vacuum chamber 103 by a conveying mechanism (not shown) and transferred to the support portion 122. At this time, the support portion 122 supports the frame 2 of the conveyance carrier 10. Even desirably, the support portion 122 supports the overlap portion (i.e., the outer circumferential portion 3c of the holding sheet 3) between the frame 2 and the holding sheet 3 of the conveyance carrier 10.

When the top surface 122a of the support portion 122 is lowered to the same or lower level as or than the surface of the stage 111, the conveyance carrier 10 is mounted on the stage 111 at a prescribed position. Plasma processing is performed on the conveyance carrier 10 being mounted on the stage 111. After completion of the plasma processing, the support portion 122 is elevated, and the conveyance carrier 10 is transferred to the conveying mechanism.

In the third and fourth embodiments, the elevation mechanism 123A can elevate or lower the support portion 122 independently of each other. In mounting the conveyance carrier 10 on the stage 111 at the prescribed position, the conveyance carrier 10 is supported by the support portion 122 so that the holding sheet 3 comes into contact with the stage 111 in a state that the frame 2 is inclined with respect to the stage 111. When the conveyance carrier 10 is transferred to the conveying mechanism after completion of plasma processing, the conveyance carrier 10 is supported by the support portion 122 so as to go away from the stage 111 in a state that the frame 2 is inclined with respect to the stage 111.

Plural elevation rods 121 are connected to an end portion of the cover 124 so that the cover 124 can be elevated and lowered. The elevation rods 121 are driven, that is, elevated or lowered by an elevation mechanism 123B. The elevation mechanism 123B can perform an elevation/lowering operation independently of the elevation mechanism 123A.

A control device 128 controls operations of constituent elements of the plasma processing apparatus 100 which include the first radio-frequency power source 110A, the second radio-frequency power source 110B, the process gas source 112, the ashing gas source 113, the pressure reducing mechanism 114, the coolant circulating device 125, the elevation mechanisms 123A and 123B, the electrostatic chuck mechanism, and the heater 129.

(Frame)

The frame 2 is a frame body having an opening that is the same as or larger than the entire substrate 1 in area, and has a prescribed width and a small, approximately constant thickness. The frame 2 is rigid enough to hold and enable conveyance of the holding sheet 3 and the substrate 1.

Although there are no limitations on the shape of the opening of the frame 2, it may have a polygonal shape such as a circle, rectangle, or hexagon. The frame 2 may have notches 2a, corner cuts 2b, etc. for positioning. Example materials of the frame 2 are metals such as aluminum and stainless steel and resins. Part of one surface 3a of the holding sheet 3, that is, one surface of its outer circumferential portion 3c, is bonded to one surface of the frame 2.

(Holding Sheet)

For example, the holding sheet 3 has a surface having an adhesive (adherent surface 3a) and a surface having no adhesive (non-adherent surface 3b). Part of the adherent surface 3a, that is, one surface of its outer circumferential portion 3c, is bonded to one surface of the frame 2. The substrate 1 is bonded to a portion, exposed through the opening of the frame 2, of the adherent surface 3a.

It is preferable that the adherent surface 3a have an adhesive component whose adhesiveness is weakened when illuminated with ultraviolet light. This is to allow individual substrate portions (i.e., chips) to be peeled off the adherent surface 3a and picked up easily when they are illuminated with ultraviolet light after dicing. For example, the holding sheet 3 may be composed of an ultraviolet-curing acrylic adhesive layer (having the adherent surface 3a) and a polyolefin base sheet (having the non-adherent surface 3b). In this case, it is preferable that the thickness of the ultraviolet-curing acrylic adhesive layer be 5 to 20 μm and thickness of the polyolefin base sheet be 50 to 150 μm.

The holding sheet 3 may be conductive. Where the single-polarity ESC electrode or the double-polarity ESC electrodes that operate in the single-polarity mode are used, high absorption ability is obtained with respect to the stage 111 irrespective of whether the holding sheet 3 is conductive or not. On the other hand, where the double-polarity ESC electrodes that operate in the double-polarity mode are used, the absorption ability with respect to the stage 111 becomes low if the conductivity of the holding sheet 3 is low. Therefore, the conductive holding sheet 3 is particularly useful when the double-polarity ESC electrodes operate in the double-polarity mode because the conductive holding sheet 3 increases the absorption ability with respect to the stage 111.

(Substrate)

The substrate 1, which is an object of plasma processing, is not limited in any manner. There are no limitations on the material of the substrate 1. The substrate 1 may be a semiconductor, a dielectric, a metal, or a laminate thereof. Example semiconductors are silicon (Si), gallium arsenide (GaAs), gallium nitride (GaN), silicon carbide (SiC). Example dielectrics are silicon dioxide ($SiO_2$), silicon nitride ($Si_3N_4$), polyimide, lithium tantalate ($LiTaO_3$), and lithium niobate ($LiNbO_3$). There are no limitations on the size of the substrate 1, either. For example, the maximum diameter is about 50 to 300 mm and the thickness of the substrate 1 is about 25 to 150 μm. Furthermore, there are no limitations on the shape of the substrate 1. For example, the substrate 1 may be circular or rectangular. The substrate 1 may have a cut(s) (not shown) such as orientation flat or notches.

That surface of the substrate 1 which is not bonded to the holding sheet 3 is formed with a resist mask (not shown) in a desired pattern. The portions on which the resist mask is formed are protected from plasma etching. The portions on which the resist mask is not formed are etched by plasma from its front surface to back surface.

(Heater)

There are no limitations on the heater 129 as long as it can heat the stage 111. For example, the heater 129 may be equipped with linear heater electrodes that are made of a high-resistivity metal. Electrically connected to the AC power source 130, the heater 129 heats up as it is supplied with power from the AC power source 130. An example high-resistivity metal is tungsten (W).

The heater 129 may be disposed at any position inside the stage 111. Not to obstruct absorption of the holding sheet 3 on the stage 111 and to heat the surface-side portion of the stage 111 efficiently, it is preferable that the heater 129 be located under the ESC electrodes 119 and the radio-frequency electrode 120 and over the coolant passage 127.

The coolant passage 127 is formed inside the stage 111, and the entire stage 111 is cooled by circulating a coolant along the coolant passage 127. By heating the stage 111 with the heater 129 while cooling it with the coolant, the temperature of the surface-side portion, that is, the portion to touch the conveyance carrier 10, of the stage 111 can be controlled with high response speed.

(Electrostatic Chuck Mechanism)

The applies a voltage(s) to the ESC electrode(s) 119 disposed inside the stage 111 (electrode layer 115) from the DC power source 126 and thereby having the conveyance carrier 10 absorbed on the stage 111 utilizing Coulomb force or Johnsen-Rahbek force that acts between the conveyance carrier 10 and the stage 111. The ESC electrode 119 is disposed so that their center approximately coincides with the center of the stage 111. The center of a minimum circle that contains all of the ESC electrode 119 can be regarded as the center of the ESC electrode 119.

The ESC electrode(s) 119 may be of either the double-polarity type (operating in the double-polarity mode or the single-polarity mode) or the single-polarity type. Where the ESC electrode(s) 119 is a single-polarity type ESC electrode or double-polarity type ESC electrodes operating in the single-polarity mode, the DC power source 126 and the first radio-frequency power source 110A are activated, whereby the conveyance carrier 10 is absorbed on the stage 111. More specifically, plasma is generated in the reaction chamber 103 and the surface of the conveyance carrier 10 is charged by activating the first radio-frequency power source 110A and a voltage(s) is applied to the single-polarity ESC electrode 119 or the double-polarity type ESC electrodes 119 operating in the single-polarity mode by activating the DC power source 126, whereby absorption force is generated between the conveyance carrier 10 and the stage 111.

Where the double-polarity type ESC electrodes 119 operate in the double-polarity mode, the DC power source 126 is activated, whereby the conveyance carrier 10 is absorbed on the stage 111. More specifically, absorption force is generated between the conveyance carrier 10 and the stage 111 by applying voltages of different polarities to the positive electrode and the negative electrode of the ESC electrodes 119 by activating the DC power source 126. The following description will be directed to the case that the ESC electrodes 119 are double-polarity type ESC electrodes. However, the invention is not limited to such a case.

FIG. 3 schematically shows a relationship between the double-polarity type ESC electrodes 119 and the DC power source 126. For example, the ESC electrodes 119 are comb electrodes as shown in FIG. 3. In FIG. 3, a positive voltage V1 and a negative voltage −V1 are applied to the positive electrode and the negative electrode, respectively. However, the shape of the ESC electrodes 119 is not restricted to it and may be determined as appropriate.

In lowering the support portion 122, that is, in mounting the conveyance carrier 10 on the stage 111, voltages are applied to the ESC electrodes 119 after a start of heating of the stage 111 by the heater 129. The support portion 122 is elevated, that is, the conveyance carrier 10 is separated from the stage 111, after a start of heating of the stage 111.

The first and second embodiments will be described below in detail. However, the invention is not limited to these embodiments and various modifications are possible.

First Embodiment

Figure 4:
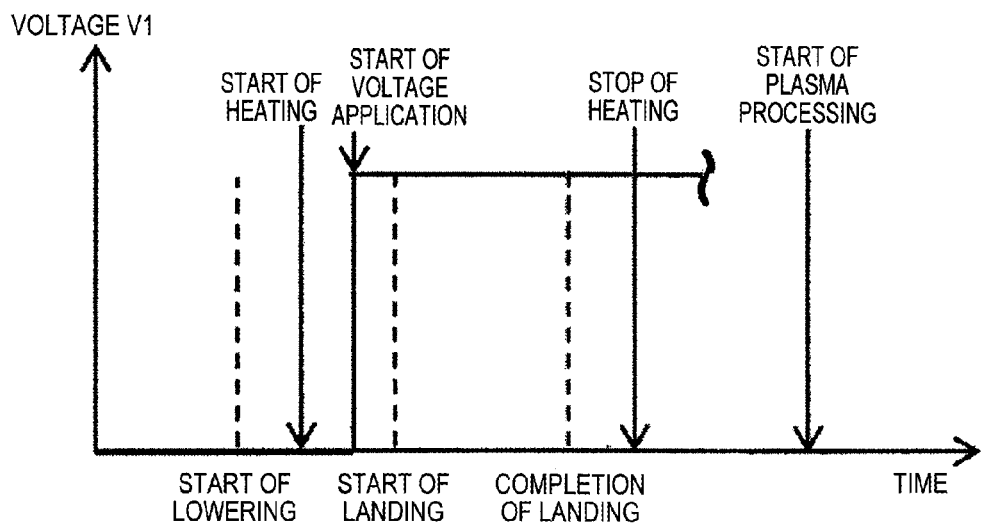
FIG. 4 is a conceptual graph showing an operation of a plasma processing apparatus according to a first embodiment of the invention in which the horizontal axis represents the time from a start of lowering of a support portion and the vertical axis represents the voltage applied to the ESC electrodes.

The first embodiment relates to how the plasma processing apparatus 100 operates when the support portion 122 is lowered. In this operation, voltages are applied to the ESC electrodes 119 after a start of heating of the stage 111 by the heater 129. FIG. 4 is a conceptual graph in which the horizontal axis represents the time from a start of lowering of the support portion 122 and the vertical axis represents the voltage applied to the ESC electrodes 119.

A time point when the support portion 122 that supports the conveyance carrier 10 starts to be lowered, a time point when the heater 129 starts to heat the stage 111, and a time point when voltage application to the ESC electrodes 119 is started are indicated in FIG. 4. The term "start of landing" means a time point when the lowest point of a warped portion of the holding sheet 3 of the conveyance carrier 10 just comes into contact with the stage 111. The term "completion of landing" means a time point when the top surface 122a of the support portion 122 has been lowered to the same or lower level as or than the surface of the stage 111 and (at least a part of) the outer circumferential portion 3c just comes into contact the stage 111. A time point when the heater 129 stops heating the stage 111 is also indicated in FIG. 4.

Although in FIG. 4 the holding sheet 3 starts to land after starts of heating and voltage application, the invention is not limited to such a case. For example, the holding sheet 3 may start to land before a start of heating or between a start of heating and a start of voltage application. Although in FIG. 4 the heating is stopped after completion of the landing of the holding sheet 3, the invention is not limited to such a case. For example, landing of the holding sheet 3 may be completed after a stop of heating. Furthermore, an operation is possible that heating is started after completion of landing of the holding sheet 3 and then voltage application is started. Above all, from the viewpoint of suppressing wrinkling of the holding sheet 3 due to its shrinkage, it is preferable that landing of the holding sheet 3 be started after a start of heating. In this case, for example, heating may be started before a start of lowering of the support portion 122.

Whether or not the lowest point of the warped portion of the holding sheet 3 has touched the stage 111 is determined on the basis of, for example, a distance D of lowering of the top surface 122a of the support portion 122. A warp Tc (described later) of the holding sheet 3 that is held by the conveyance carrier 10 is measured, and a lowering distance D of the support portion 122 that occurs when the distance T between the top surface 122a of the support portion 122 and the surface of the stage 111 becomes equal to Tc is recognized in advance. A time point when the lowering distance of the support portion 122 has become equal to D is regarded as a time point when the lowest point of the warped portion of the holding sheet 3 being held by the conveyance carrier 10 has just touched the stage 111.

Figure 5:
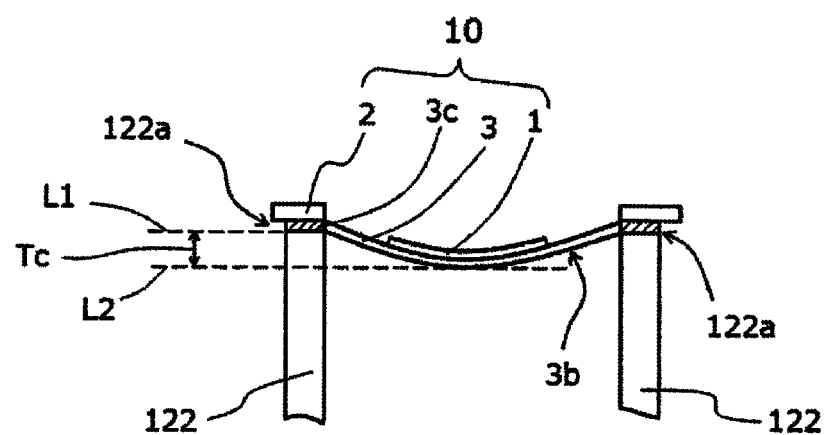
FIG. 5 illustrates a warp of a holding sheet that occurs in the first embodiment.

For example, a warp Tc is determined in the following manner. As shown in FIG. 5, the conveyance carrier 10 is placed on the top surface 122a of the support portion 122 that is located at such a height that the holding sheet 3 is not in contact with the stage 111. In this state, in a cross section taken so as to pass the center of the conveyance carrier 10, the warp Tc is determined as a distance between a straight line L1 that passes the bottom surface of the outer circumferential portion 3c of the holding sheet 3 and a tangential line L2 to the bottom surface (3b) of a warped portion of the holding sheet 3 at its lowest point.

It is not always necessary to measure a warp Tc in the reaction chamber 103 or the plasma processing apparatus 100. For example, a warp Tc may be measured by, for example, a noncontact optical measuring instrument before processing by the plasma processing apparatus 100. To facilitate understanding, the warp Tc is exaggerated in FIG. 5. For example, a warp Tc of about 50 to 800 μm occurs in the case where the diameter of the frame 2 is about 300 mm, the diameter and the thickness of the substrate 1 are about 150 mm and about 100 mm, respectively, and the thickness of the holding sheet 3 is about 110 μm.

How the plasma processing apparatus 100 operates will be described below with reference to FIGS. 6A to 6E. To facilitate understanding, the heater 129 that is doing a heating operation and the ESC electrodes 119 to which voltages are applied are hatched in FIGS. 6A to 6E. Also in FIGS. 6A to 6E, warps are exaggerated for the sake of description.

Figure 6A:
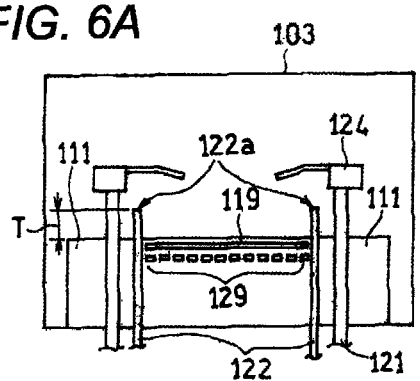
FIGS. 6A to 6E are conceptual diagrams showing an operation of the plasma processing apparatus according to the first embodiment.

In the vacuum chamber 103, as shown in FIG. 6A, the support portion 122 stands by at the elevated position for support of the conveyance carrier 10 and the cover 124 also stands by at the elevated position. As shown in FIG. 6B, the conveyance carrier 10 is carried into the vacuum chamber 103 by the conveying mechanism (not shown) and transferred to the support portion 122. At this time, the heater 129 is off and the stage 111 is cooled to, for example, about 15° C. by the coolant that is circulated along the coolant passage 127 all the time.

The conveyance carrier 10 is placed on the top surface 122a of the support portion 122 in such a manner that the surface (adherent surface 3a), holding the substrate 1, of the holding sheet 3 is located up. The frame 2 may be placed on the top surface 122a of the support portion 122 either via the outer circumferential portion 3c of the holding sheet 3 or directly. From the viewpoint of preventing the holding sheet 3 from peeling off the frame 2 when the support portion 122 is elevated or lowered, it is preferable that the conveyance carrier 10 be placed on the top surface 122a of the support portion 122 via the outer circumferential portion 3c of the holding sheet 3.

The heater 129 starts to heat the stage 111 after the transfer of the conveyance carrier 10 to the support portion 122 before contact of the lowest point of the holding sheet 3 to the stage 111 (a relationship T>Tc holds in this period). As described above, the stage 111 is being cooled. However, since the heater 129 is located closer to the surface of the stage 111 than the coolant passage 127 is, the surface of the stage 111 is heated to, for example, about 30 to 80° C. relatively in a short time.

Where the ESC electrode 119 is of the single-polarity type, plasma is generated in the vacuum chamber 103 by inputting low power (e.g., 500 W or less) to the antenna 109 from the first radio-frequency power source 110A after the placement of the conveyance carrier 10 on the top surface 122a of the support portion 122 and the exit of the conveying mechanism from the vacuum chamber 103 before application of a voltage to the ESC electrode 119. As a result, the surface of the conveyance carrier 10 is charged to establish a state that the conveyance carrier 10 can be absorbed on the stage 111 upon application of a voltage to the ESC electrode 119.

Figure 6D:
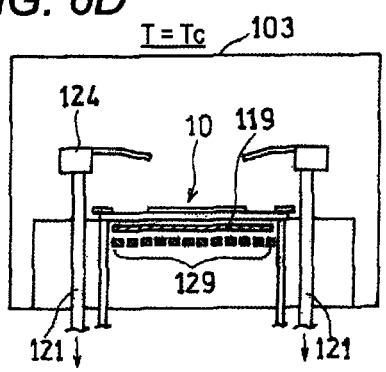
Figure 6B:
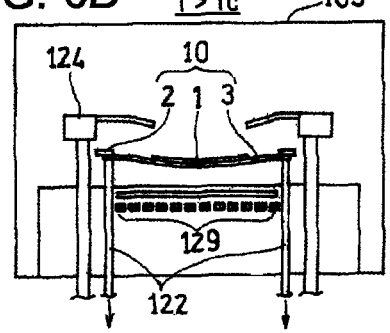
Figure 6E:
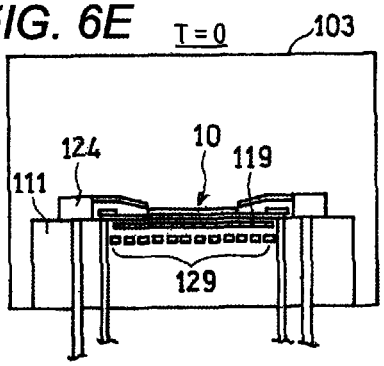
Figure 6C:
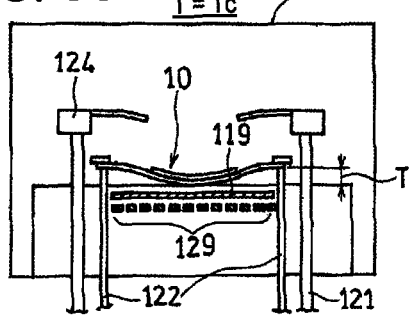

Subsequently, as shown in FIG. 6C, application of voltages to the ESC electrodes 119 is started after the start of heating by the heater 129 before contact of the lowest point of the warped portion of the holding sheet 3 to the stage 111 (T=Tc). As a result, the holding sheet 3 that is in contact with the stage 111 is heated and absorbed on the stage 111. Since the stage 111 is being heated, the holding sheet 3 is not prone to be wrinkled. Therefore, the holding sheet 3 is absorbed on the stage 111 in a state that it is not wrinkled.

Even where heating of the stage 111 is started after completion of landing of the holding sheet 3, the holding sheet 3 that has shrunk once can be softened and expanded because the stage 111 is heated to about 30 to 80° C. Therefore, the holding sheet 3 is expanded so as to adapt to the surface of the flat stage 111 or is deformed into a shape that conforms to the surface of the stage 111. Thus, the holding sheet 3 is absorbed on the stage 111 in a state that it is not wrinkled.

Then the support portion 122 is lowered further, whereby at least a part of the outer circumferential portion 3c of the holding sheet 3 comes into contact with the stage 111 (T=0) and the conveyance carrier 10 is mounted on the stage 111 at the prescribed position (see FIG. 6D). If the top surface 122a of the support portion 122 has been lowered to the same or lower level as or than the surface of the stage 111, it can be determined that the outer circumferential portion 3c of the holding sheet 3 is in contact with the stage 111.

When the top surface 122a of the support portion 122 has been lowered to the same or lower level as or than the surface of the stage 111, as shown in FIG. 6E, the elevation rods 121 are driven by the elevation mechanism 123B and thereby lower the cover 124 to a prescribed position. The heating by the heater 129 may already be stopped at this time point. The heating may be stopped after the lowering of the cover 124 before a start of plasma processing. After the stop of the heating by the heater 129, the stage 111 and the conveyance carrier 10 are cooled in a relatively short time by the coolant that is circulated along the coolant passage 127 all the time.

When the cover 124 has been set at the prescribed lowered position, the frame 2 and the portion of the holding sheet 3 that is not holding the substrate 1 are covered with the cover 124 without being in contact with it and the substrate 1 is exposed through the window 124W of the cover 124.

For example, the portion, excluding the end portion, of the cover 124 has a doughnut shape having an approximately circular outline and has a prescribed width and a small thickness. The inner diameter (i.e., the diameter of the window 124W) and the outer diameter of the portion, excluding the end portion, of the cover 124 is smaller than the inner diameter of the frame 2 and larger than the outer diameter of the frame 2, respectively. Therefore, when the conveyance carrier 10 is mounted on the stage 111 at the prescribed position and the cover 124 has been lowered, the frame 2 and at least a part of the holding sheet 3 can be covered with the cover 124. At least a part of the substrate 1 is exposed through the window 124W. At this time, the cover 124 is in contact with none of the frame 2, the holding sheet 3, and the substrate 1. Example materials of the cover 124 are ceramic materials such as alumina and aluminum nitride, dielectrics such as quartz, and metals such as aluminum (including a case that the surface is alumite-treated).

When the support portion 122 and the cover 124 have been set at the prescribed positions, process gas is introduced into the vacuum chamber 103 from the process gas source 112 via the gas inlet 103a. On the other hand, the pressure reducing mechanism 114 exhausts gas from the vacuum chamber 103 via the exhaust outlet 103b to maintain a prescribed pressure in the vacuum chamber 103.

Then plasma P is generated in the vacuum chamber 103 by inputting radio-frequency power to the antenna 109 from the first radio-frequency power source 110A. The generated plasma P is composed of ions, electrons, radicals, etc. Plasma processing on the substrate 1 is started by inputting radio-frequency power to the radio-frequency electrode 120 from the second radio-frequency power source 110B. The energy of incidence of ions on the substrate 1 can be controlled by the bias voltage that is applied from the second radio-frequency power source 110B to the radio-frequency electrode 120. The portions, exposed from the resist mask formed on the substrate 1, of the substrate 1 are removed from their top surfaces to bottom surfaces by a physico-chemical reaction to the generated plasma P, whereby the substrate 1 is divided into individual pieces.

The plasma processing conditions are set according to the material of the substrate and other factors. For example, an Si substrate 1 is etched by generating plasma P of a fluorine-inclusive gas such as sulfur hexafluoride ($SF_6$) in the vacuum chamber 103. In this case, for example, the pressure in the vacuum chamber 103 is controlled to 10 to 50 Pa by the pressure reducing mechanism 114 while an $SF_6$ gas is supplied from the process gas source 112 at 100 to 800 sccm. Radio-frequency power of 1,000 to 5,000 W and 13.56 MHz is supplied to the antenna 109 and radio-frequency power of 50 to 1,000 W and 13.56 MHz is supplied to the radio-frequency electrode 120. At the same time, to suppress temperature increase of the conveyance carrier 10 due to the plasma processing, the temperature of the coolant that is being circulated in the stage 111 by the coolant circulating device 125 is set as −20 to 20° C. As a result, the temperature of the conveyance carrier 10 under plasma processing can be made lower than or equal to 100° C.

It is desirable that in the etching processing the portions, exposed from the resist mask, of the substrate 1 be etched perpendicularly to their surfaces. To this end, for example, an etching step using plasma of a fluorine-based gas such as $SF_6$ and a protection film deposition step using plasma of a carbon fluoride gas such as perfluorocyclobutane ($C_4F_8$) may be executed alternately.

After the generation of plasma P, the operation mode of the ESC electrodes 119 may be switched from the double-polarity mode to the single-polarity mode. Where the operation mode of the ESC electrodes 119 is the double-polarity mode, the surface of the substrate 1 over the positive electrode of the ESC electrodes 119 (positive-electrode-side surface) and the surface of the substrate 1 over the negative electrode of the ESC electrodes 119 (negative-electrode-side surface) are slightly different from each other in potential. Furthermore, the positive-electrode-side surface receives stronger Coulomb force than the negative-electrode-side surface. Therefore, the two kinds of surfaces receive slightly different absorption forces.

As a result, if plasma processing is started in the double-polarity mode, the difference, between the positive-electrode-side surface and the negative-electrode-side surface, in the absorption force acting between the conveyance carrier 10 and the stage 111 causes temperature differences in the substrate 1. Furthermore, the positive-electrode-side surface and the negative-electrode-side surface may have differences in the effective bias voltage applied to the substrate 1. Still further, the positive-electrode-side surface and the negative-electrode-side surface may have differences in the degree of etching. These are factors that may make it difficult to perform uniform plasma processing on the substrate 1.

For example, the switching from the double-polarity mode to the single-polarity mode is made by inverting the polarity of the voltage that is applied to one of the positive electrode and the negative electrode or changing the voltage that is applied to one of the positive electrode and the negative electrode so that it becomes equal to the voltage applied to the other electrode.

When switching is made from the double-polarity mode to the single-polarity mode, there may occur an event that the absorption force between the conveyance carrier 10 and the stage 111 weakens instantaneously and the cooling of the conveyance carrier 10 becomes insufficient. In view of this, it is preferable that the switching from the double-polarity mode to the single-polarity mode be made during a period when low power (e.g., 500 W) is input from the first radio-frequency power source 110A to the antenna 109.

In other words, the operation mode of the ESC electrodes 119 is switched from the double-polarity mode to the single-polarity mode while low-power plasma is being generated by inputting low power to the antenna 109 from the first radio-frequency power source 110A. It is preferable to perform plasma processing by inputting high power to the antenna 109 from the first radio-frequency power source 110A after completion of the switching (see FIG. 7C). Where the power that is input to the antenna 109 is low, the energy of generated plasma is low and hence the amount of heat that is transmitted from the plasma to the conveyance carrier 10 is small. Therefore, the necessity to cause the conveyance carrier 10 to be absorbed on the stage 111 strongly is low. As a result, trouble is less prone to occur due to insufficient cooling of the conveyance carrier 10 when switching is made from the double-polarity mode to the single-polarity mode.

Figure 7A:
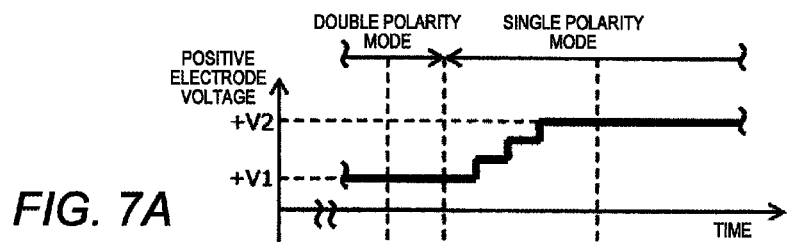
FIGS. 7A to 7C show an operation of the plasma processing apparatus according to the first embodiment.
Figure 7B:
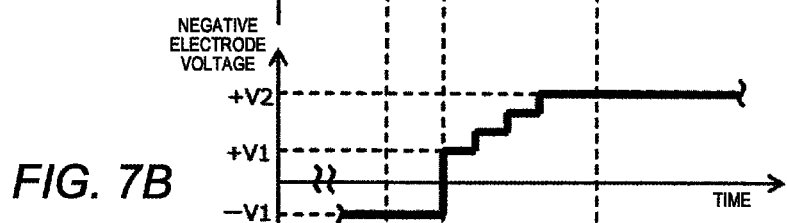
Figure 7C:
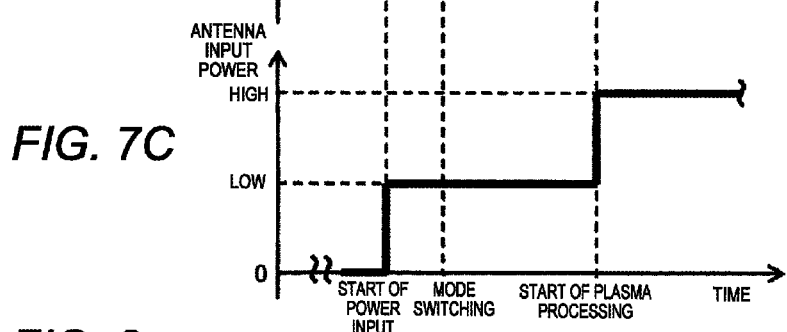

The voltage applied to each ESC electrode 119 may be increased after the switching to the single-polarity mode before a start of plasma processing. FIGS. 7A and 7B are conceptual graphs in which the horizontal axis represents the time from a start of input of power to the antenna 109 from the first radio-frequency power source 110A and the vertical axis represents the voltage that is applied to each ESC electrode 119. As shown in FIGS. 7A and 7B, after the switching to the single-polarity mode, the voltage applied to each ESC electrode 119 is increase to +V2 stepwise so that the conveyance carrier 10 is absorbed on the stage 111 with sufficient strength. Then plasma processing is started by inputting high power to the antenna 109 from the first radio-frequency power source 110A.

The above operation will be described below in a more specific manner. For example, in the double-polarity mode, the positive electrode voltage is 1,500 V (+V1) and the negative electrode voltage is −1,500 V (−V1). And the power that is input to the antenna 109 is low power of 500 W. Then switching is made from the double-polarity mode to the single-polarity mode by changing the negative electrode voltage from −1,500 V (−V1) to 1,500 V (+V1). Subsequently, the positive electrode voltage and the negative electrode voltage are increased stepwise to 3,000 V (+V2). Finally, the power that is input to the antenna 109 is increased to high power of 2,000 to 5,000 W and plasma processing is performed. In this manner, the conveyance carrier 10 can be absorbed on the stage 111 strongly and cooled reliably during plasma processing while occurrence of trouble due to the switching from the double-polarity mode to the single-polarity mode is prevented.

Ashing is performed after the fragmentation. An ashing process gas (e.g., an oxygen gas or a mixed gas of an oxygen gas and a fluorine-inclusive gas) is introduced into the vacuum chamber 103 from the ashing gas source 113. On the other hand, exhaust is performed by the pressure reducing mechanism 114, whereby the pressure in the vacuum chamber 103 is kept at a prescribed value. Oxygen plasma is generated in the vacuum chamber 103 by inputting radio-frequency power from the first radio-frequency power source 110A, whereby the resist mask that is formed on the surface, exposed through the window 124W of the cover 124, of the substrate 1 (chips) is removed completely.

Finally, the conveyance carrier 10 which holds the fragmented substrate 1 is carried out of the plasma processing apparatus 100. The substrate 1 may be carried out according to a procedure that is reverse to the procedure for mounting the substrate 1 on the stage 111 which is shown in FIGS. 6A to 6E. That is, after the cover 124 is elevated to a prescribed position, the absorption of the conveyance carrier 10 on the stage 111 is canceled by decreasing the voltages applied to the ESC electrodes 119 to zero and the support portion 122 is elevated.

If the conveyance carrier 10 is kept absorbed on the stage 111 because part of the charge that was produced at the time of the plasma processing remains in the conveyance carrier 10, if necessary, the residual charge may be removed from the conveyance carrier 10 by generating weak plasma by inputting low radio-frequency power of, for example, about 200 W to the antenna 109 from the first radio-frequency power source 110A before or during the elevation of the top surface 122a of the support portion 122.

Second Embodiment

Figure 8:
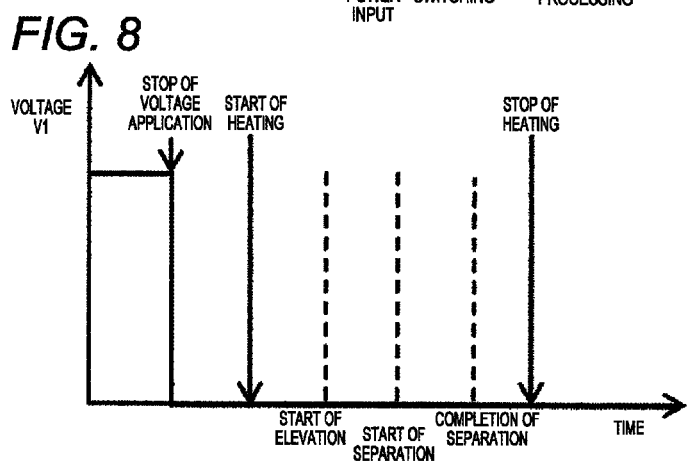
FIG. 8 is a conceptual graph showing an operation of a plasma processing apparatus according to a second embodiment of the invention in which the horizontal axis represents the time from a stop of application of voltages to the ESC electrodes and the vertical axis represents the voltage applied to the ESC electrodes.

The second embodiment relates to how the plasma processing apparatus 100 operates when the support portion 122 is elevated. The support portion 122 is elevated after a start of heating of the stage 111 by the heater 129. In the other points, the plasma processing apparatus 100 according to the second embodiment is the same as that according to the first embodiment. FIG. 8 is a conceptual graph in which the horizontal axis represents the time from a stop of application of voltages to the ESC electrodes 119 and the vertical axis represents the voltage applied to the ESC electrodes 119.

A time point when voltage application to the ESC electrodes 119 is stopped, a time point when the heater 129 starts to heat the stage 111, a time point when the support portion 122 that supports the conveyance carrier 10 starts to be elevated, and a time point when the holding sheet 3 being held by the conveyance carrier 10 starts to be separated from the state 111 are indicated in FIG. 8. The term "completion of separation" means a time point when the holding sheet 3 is completely detached from the stage 111. A time point when the heater 129 stops heating the stage 111 is also indicated in FIG. 8. Although in FIG. 8 heating of the stage 111 is started after a stop of voltage application, the invention is not limited to such a case. For example, heating of the stage 111 may be started before a stop of voltage application.

How the plasma processing apparatus 100 operates will be described below with reference to FIGS. 9A to 9E. To facilitate understanding, the heater 129 that is doing a heating operation and the ESC electrodes 119 to which voltages are applied are hatched in FIGS. 9A to 9E. Also in FIGS. 9A to 9E, warps are exaggerated for the sake of description.

Figure 9A:
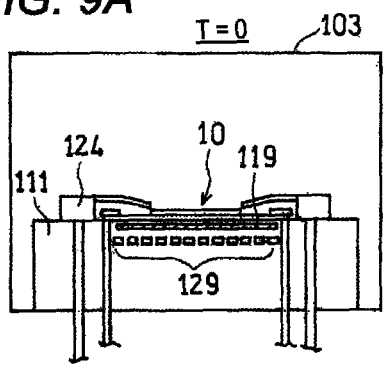
FIGS. 9A to 9E are conceptual diagrams showing an operation of the plasma processing apparatus according to the second embodiment.

FIG. 9A shows a state that the conveyance carrier 10 that has just been subjected to plasma processing is mounted on the stage 111 (T=0). In this state, voltages are being applied to the ESC electrodes 119. The stage 111 is cooled to, for example, 15° C. or less by the coolant that is circulated along the coolant passage 127 (not shown) all the time, as a result of which the holding sheet 3 is shrunk.

Then the cover 124 is elevated by driving the support portion 121 and the voltage application to the ESC electrodes 119 is stopped. Either of the start of elevation of the cover 124 and the stop of voltage application may be made first. Considering the fact that the cover 124 has been heated by the plasma processing, it is preferable to stop voltage application after a start of elevation of the cover 124, because this makes it easier to suppress heating of the conveyance carrier 10.

Figure 9D:
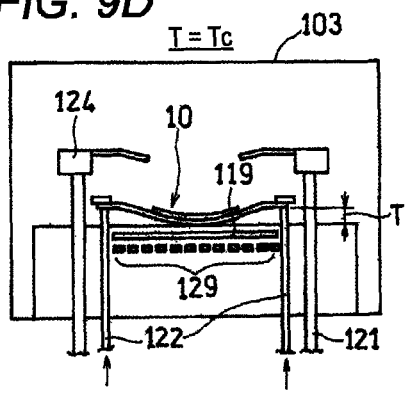
Figure 9B:
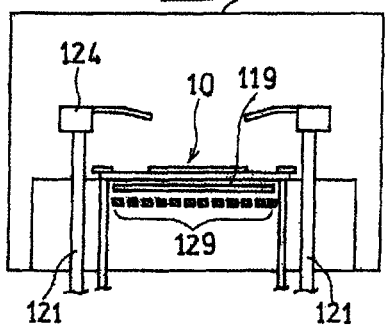
Figure 9E:
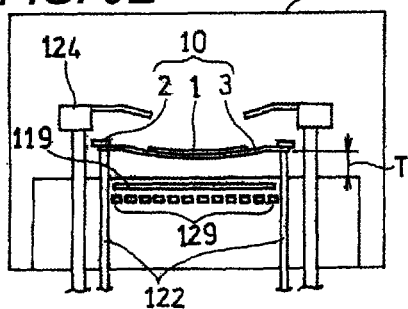

When the cover 124 has been elevated to the prescribed position, as shown in FIG. 9B the heater 129 starts to heat the stage 111. As described above, the stage 111 is being cooled. However, since the heater 129 is located closer to the surface of the stage 111 than the coolant passage 127 is, the surface of the stage 111 is heated by the heater 129. The holding sheet 3 which is in contact with the stage 111 is also heated, whereby the tension of the holding sheet 3 is lowered. At this time, the surface of the stage 111 is heated to, for example, about 30 to 80° C.

Figure 9C:
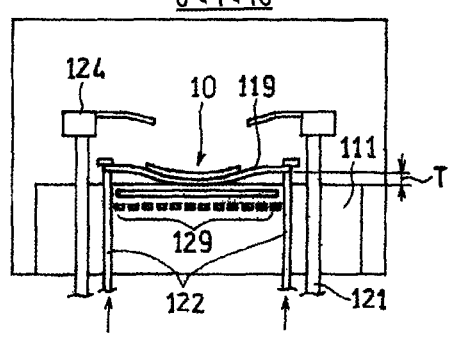

Then elevation of the support portion 122 is started. As the support portion 122 is elevated, as shown in FIGS. 9C and 9D the holding sheet 3 starts to be separated from the stage 111 ($0<T \leq Tc$). Since the surface of the stage 111 is being heated, the tension of the holding sheet 3 is reduced and hence the holding sheet 3 can be separated from the stage 111 smoothly. Since the surface of the stage 111 is being heated, shrinkage of the holding sheet 3 is removed. This makes it possible to suppress damaging of individual chips due to contact between adjoining chips.

The support portion 122 continues to be elevated. The heating by the heater 129 is stopped after completion of the separation of the holding sheet 3 (see FIG. 9E; $T>Tc$). When the top surface 122a of the support portion 122 reaches the position where to transfer the conveyance carrier 10, the elevation of the support portion 122 is stopped and the conveyance carrier 10 is transferred to the conveying mechanism (not shown) and carried out of the vacuum chamber 103.

In the first and second embodiments, heating of the stage 111 is started after the conveyance carrier 10 is carried into the vacuum chamber 103. However, heating of the stage 111 may be started before the conveyance carrier 10 is carried into the vacuum chamber 103. In this case, it is possible to volatilize volatile reaction products that were generated by plasma processing, floated in the vacuum chamber 103, and were absorbed on the surface of the stage 111. Thus, pollution of the stage 111 by volatile reaction products can be suppressed.

Next, the third and fourth embodiments will be described below in detail. However, the invention is not limited to these embodiments and various modifications are possible.

Third Embodiment

The third embodiment relates to how the plasma processing apparatus 100 operates when the conveyance carrier 10 is mounted on the stage 111. In this operation, the conveyance carrier 10 is supported by the support portion 122 so that the holding sheet 3 comes into contact with the stage 111 in a state that the frame 2 is inclined with respect to the stage 111. That is, when the holding sheet 3 starts to touch the stage 111, the angle θd of inclination of the frame 2 with respect to the stage 111 is larger than 0°.

Figure 13:
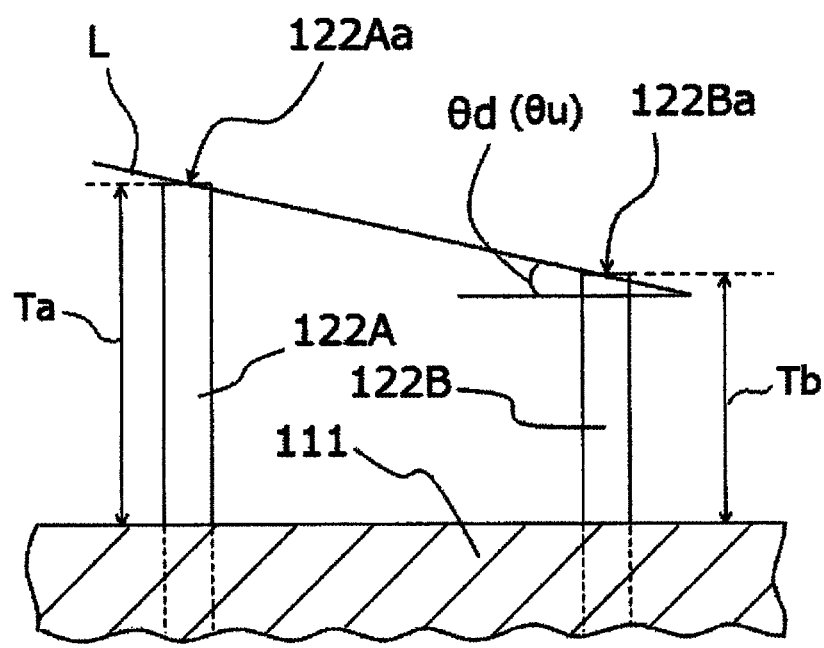
FIG. 13 illustrates an inclination angle in the third embodiment.

To set the inclination angle θd larger than 0°, the conveyance carrier 10 is placed on the top surface of a support portion 122A whose distance T from the stage 111 is set equal to Ta and the top surface of a support portion 122B whose distance T from the stage 111 is set equal to Tb which is smaller than Ta and the support portions 122A and 122B are lowered so that the relationship Ta>Tb is maintained (see FIG. 13). Another method is possible in which the conveyance carrier 10 is placed on the top surfaces of the support portions 122A and 122B whose distances T from the stage 111 are set the same (Ta=Tb) and their lowering speeds are made different from each other so that a relationship Ta>Tb is established while they are lowered. A further method is possible in which the conveyance carrier 10 is placed on the top surfaces of the support portions 122A and 122B whose distances T from the stage 111 are set the same (Ta=Tb) and the support portions 122A and 122B are lowered at the same speed. The support portion 122A is stopped before the holding sheet 3 touches the stage 111 whereas the support portion 122B continues to descend. In each of these methods, after the holding sheet 3 starts to touch the stage 111, the support portion 122A is lowered again.

The conveyance carrier 10 may be supported also by a support portion other than the support portions 122A and 122B. In the following description, for the sake of convenience, it is assumed that the conveyance carrier 10 is supported only by the support portions 122A and 122B.

Figure 10A:
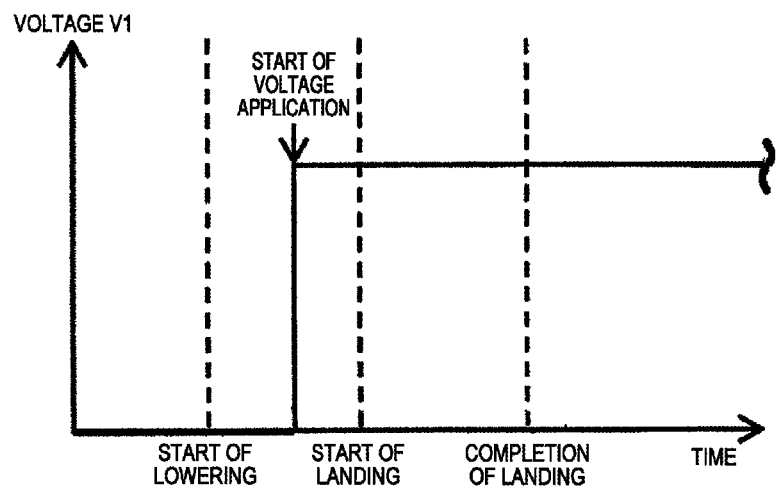
FIG. 10A is a conceptual graph showing one example operation of a plasma processing apparatus according to a third embodiment of the invention in which the horizontal axis represents the time from a start of lowering of the support portion and the vertical axis represents the voltage applied to the ESC electrodes.

This embodiment is directed to the case that the conveyance carrier 10 is placed on the stage 111 by the first method among the above-described methods and voltages are applied to the ESC electrodes 119 before the holding sheet 3 comes into contact with the stage 111. FIG. 10A is a conceptual graph in which the horizontal axis represents the time from a start of lowering of the support portion 122 and the vertical axis represents the voltage applied to the ESC electrodes 119.

A time point when the control device 128 starts to lower both of the support portions 122A and 122B that support the conveyance carrier 10 and a time point when voltage application to the ESC electrodes 119 is started are indicated in FIG. 10A. The term "start of landing" means a time point when the lowest point of a warped portion of the holding sheet 3 of the conveyance carrier 10 just comes into contact with the stage 111. The term "completion of landing" means a time point when the top surface 122Aa of the support portion 122A has been lowered to the same or lower level as or than the surface of the stage 111 and the outer circumferential portion 3c of the holding sheet 3 just comes into contact the stage 111. At this time, all of the outer circumferential portion 3c may come into contact with the stage 111.

Figure 10B:
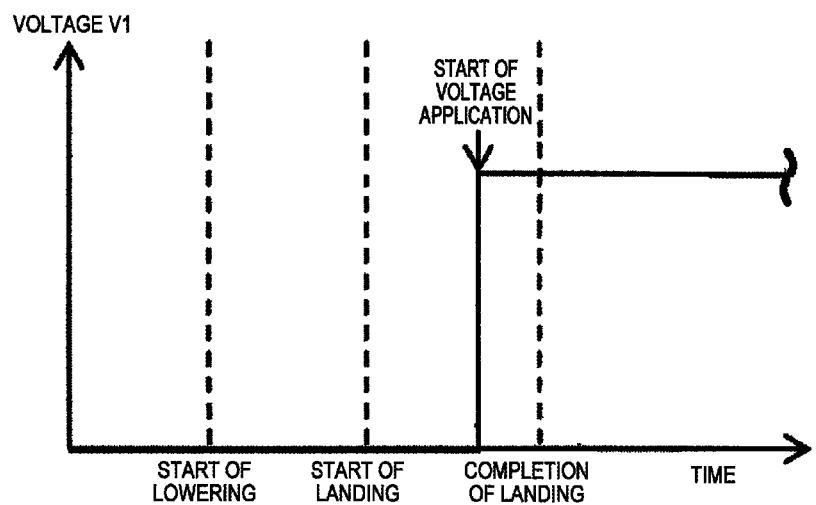
FIG. 10B is a conceptual graph showing another example operation of the plasma processing apparatus according to the third embodiment in which the horizontal axis represents the time from a start of lowering of the support portion and the vertical axis represents the voltage applied to the ESC electrodes.
Figure 10C:
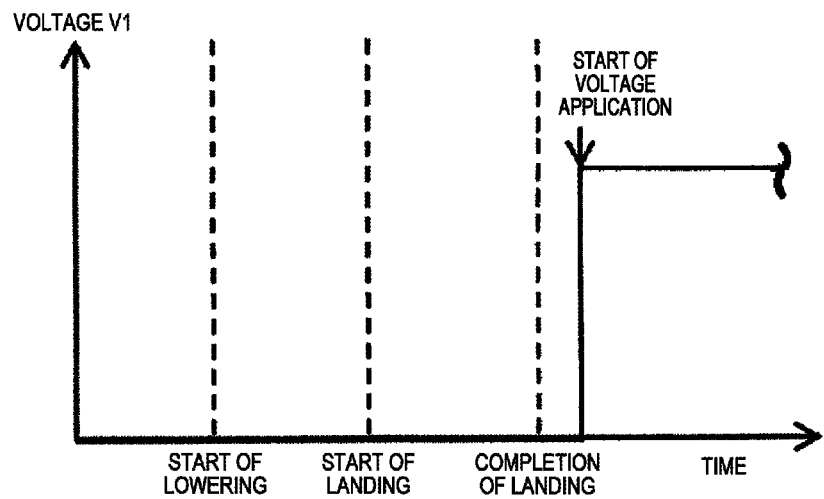
FIG. 10C is a conceptual graph showing a further example operation of the plasma processing apparatus according to the third embodiment in which the horizontal axis represents the time from a start of lowering of the support portion and the vertical axis represents the voltage applied to the ESC electrodes.

There are no limitation on the timing of voltage application to the ESC electrodes 119. For example, as shown in FIG. 10B, voltage application may be started after a start of landing of the holding sheet 3 before completion of the landing. As a further alternative, as shown in FIG. 10C, voltage application may be started after completion of landing. Among these kinds of timing, from the viewpoint of suppressing wrinkling of the holding sheet 3, it is preferable that voltage application be started before a start of landing of the holding sheet 3.

Whether or not the lowest point of the warped portion of the holding sheet 3 has touched the stage 111 is determined on the basis of, for example, a distance Db of lowering of the top surface 122Ba of the support portion 122B. A warp Tcb (described later) of the holding sheet 3 that is held by the conveyance carrier 10 is measured, and a lowering distance Db of the support portion 122B that occurs when the distance Tb between the top surface 122Ba of the support portion 122B and the surface of the stage 111 becomes equal to Tcb is recognized in advance. A time point when the lowering distance of the support portion 122B has become equal to Db is regarded as a time point when part of the holding sheet 3 being held by the conveyance carrier 10 has just touched the stage 111.

Figure 11:
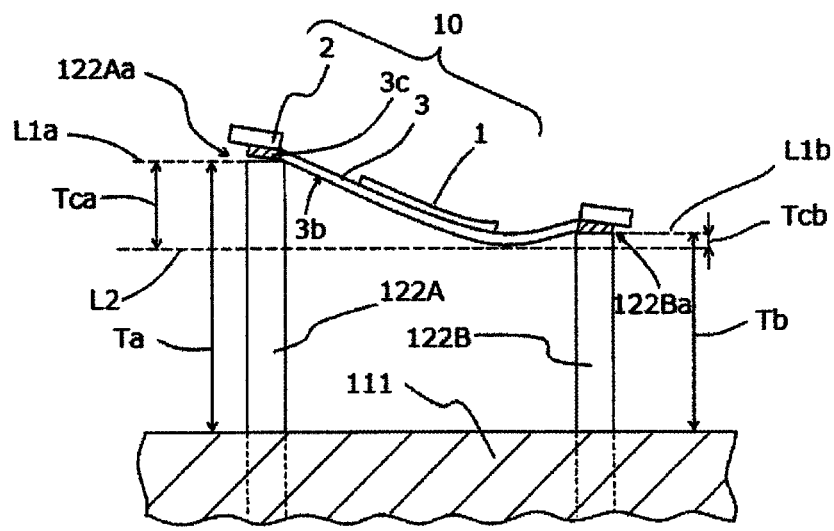
FIG. 11 illustrates a warp of a holding sheet that occurs in the third embodiment.

For example, a warp Tcb is determined in the following manner. As shown in FIG. 11, the conveyance carrier 10 is placed on the top surface 122Aa of the support portion 122A and the top surface 122Ba of the support portion 122B. The conveyance carrier 10 can be supported in an inclined state by setting the top surfaces 122Aa and 112Ba at different heights. In this state, in a cross section taken so as to pass the center of the conveyance carrier 10, the warp Tcb is determined as a distance between a straight line L1$b$ that passes the top surface 122Ba and a tangential line L2 to the bottom surface (3$b$) of a warped portion of the holding sheet 3 at its lowest point. The warp Tca is determined as a distance between a line L1$a$ that passes the top surface 122Aa and the tangential line L2.

It is not always necessary to measure a warp Tcb in the reaction chamber 103 or the plasma processing apparatus 100. For example, a warp Tcb may be measured by, for example, a noncontact optical measuring instrument before processing by the plasma processing apparatus 100. To facilitate understanding, the warp and the inclination are exaggerated in FIG. 11. For example, a warp Tcb of about 50 to 800 μm occurs in the case where the diameter of the frame 2 is about 300 mm, the diameter and the thickness of the substrate 1 are about 150 mm and about 100 mm, respectively, and the thickness of the holding sheet 3 is about 110 μm and the frame 2 is held so as to be inclined with respect to the stage 111 by about 0.05° to 0.1°.

How the plasma processing apparatus 100 operates will be described below with reference to FIGS. 12A to 12F. To facilitate understanding, the ESC electrodes 119 to which voltages are applied are hatched in FIGS. 12A to 12F. Also in FIGS. 12A to 12F, warps are exaggerated for the sake of description.

In the vacuum chamber 103, as shown in FIG. 12A, the support portion 122 stands by for support of the conveyance carrier 10 and the cover 124 stands by at the elevated position. The conveyance carrier 10 is carried into the vacuum chamber 103 by the conveying mechanism (not shown) and transferred to the support portion 122 (in the embodiment, 122A and 122B). In this state, the heights of the top surfaces 122Aa and 122Ba as measured from the surface of the stage 111 are the same (Ta=Tb).

The conveyance carrier 10 is placed on the top surfaces 122Aa and 122Ba of the support portions 122A and 122B in such a manner that the surface (adherent surface 3$a$), holding the substrate 1, of the holding sheet 3 is located up. The frame 2 may be placed on the top surfaces 122Aa and 122Ba of the support portions 122A and 122B either via the outer circumferential portion 3$c$ of the holding sheet 3 or directly. From the viewpoint of preventing the holding sheet 3 from peeling off the frame 2 when the support portions 122A and 122B are elevated or lowered, it is preferable that the conveyance carrier 10 be placed on the top surfaces 122Aa and 122Ba of the support portions 122A and 122B via the outer circumferential portion 3$c$ of the holding sheet 3.

After the conveyance carrier 10 has been transferred to the support portions 122A and 122B, the support portion 122B is lowered slightly (Ta>Tb>Tca). As a result, as shown in FIG. 12B, the conveyance carrier 10 is supported by the support portions 122A and 122B in a state that the frame 2 is inclined with respect to the stage 111. The inclination angle θd of the frame 2 is not limited to any particular range as long as it is larger than 0° and does not slide down from the support portions 122A and 122B; the inclination angle θd may be set as appropriate according to the warp Tc of the holding sheet 3. From the viewpoint of preventing the holding sheet 3 from being wrinkled when absorbed on the stage 111, it is preferable that the inclination angle θd of the frame 2 be in a range of 0.01° to 5.0° and it is even preferable that the inclination angle θd be in a range of 0.1° to 2.0°.

For example, an inclination angle θd is determined in the following manner. As shown in FIG. 13, among the support portion 122 that supports the frame 2, a support portion 122A whose top surface 122Aa is most distant from the stage 111 and a support portion 122B whose top surface 122Ba is closest to the stage 111 are determined and a line L that connects the top surfaces 122Aa and 122Ba is drawn. The angle formed by the line L and the surface of the stage 111 is employed as an inclination angle θd.

Where the ESC electrodes 119 is of the single-polarity type, plasma is generated in the vacuum chamber 103 by inputting low power (e.g., 500 W or less) to the antenna 109 from the first radio-frequency power source 110A after the transfer of the conveyance carrier 10 to the support portions 122A and 122B and the exit of the conveying mechanism from the vacuum chamber 103 before application of a voltage to the ESC electrode 119. As a result, the surface of the conveyance carrier 10 is charged to establish a state that the conveyance carrier 10 can be absorbed on the stage 111 upon application of a voltage to the ESC electrode 119.

As shown in FIG. 12C, the support portions 122A and 122B are lowered with the frame 2 kept inclined with respect to the stage 111. Therefore, a portion, closer to the support portion 122B, the holding sheet 3 touches the stage 111 first and the portion, in contact with the stage 111, of the holding sheet 3 expands gradually toward the side closer to the support portion 122A. That is, the portion, in contact with the stage 111, of the holding sheet 3 expands gradually from the portion near the one end of the holding sheet 3. Thus, the holding sheet 3 is less prone to be wrinkled.

Furthermore, voltage application to the ESC electrodes 119 is started after the start of lowering of the support portions 122A and 122B to the contact of the lowest point of the warped portion of the holding sheet 3 to the stage 111 (Tb=Tcb). Therefore, the holding sheet 3 is absorbed on the stage 111 gradually starting from its portion that is in contact with the stage. Thus, the holding sheet 3 can be absorbed on the stage 111 without being wrinkled.

The support portions 122A and 122B are lowered further, whereby as shown in FIG. 12D the top surface 122Ba becomes in the same level as the surface of the stage 111 (Ta>0, Tb=0). Then the support portion 122A is lowered until its top surface 122Aa becomes in the same level as the surface of the stage 111 (Ta=Tb=0), whereby the conveyance carrier 10 is mounted at the prescribed position (see FIG. 12E). When the support portion 122A has been lowered to such an extent that its top surface 122Aa becomes in the same or lower level as or than the surface of the stage 111, it can be determined that the outer circumferential portion 3$c$ of the holding sheet 3 is in contact with the stage 111.

When the top surface 122Aa of the support portion 122A has been lowered to the same or lower level as or than the surface of the stage 111, the elevation rods 121 are driven by the elevation mechanism 123B, whereby the cover 124 is lowered to the prescribed position (see FIG. 12F).

When the cover 124 has been set at the prescribed lowered position, the frame 2 and the portion of the holding sheet 3 that is not holding the substrate 1 are covered with the cover 124 without being in contact with it and the substrate 1 is exposed through the window 124W of the cover 124.

When the support portions 122A and 122B and the cover 124 have been set at the prescribed positions, process gas is introduced into the vacuum chamber 103 from the process gas source 112 via the gas inlet 103a. On the other hand, the pressure reducing mechanism 114 exhausts gas from the vacuum chamber 103 via the exhaust outlet 103b to maintain a prescribed pressure in the vacuum chamber 103.

Then plasma P is generated in the vacuum chamber 103 by inputting radio-frequency power to the antenna 109 from the first radio-frequency power source 110A. The generated plasma P is composed of ions, electrons, radicals, etc. The plasma processing on the substrate 1 is started by inputting radio-frequency power to the radio-frequency electrode 120 from the second radio-frequency power source 110B. The energy of incidence of ions on the substrate 1 can be controlled by the bias voltage that is applied from the second radio-frequency power source 110B to the radio-frequency electrode 120. The portions, exposed from the resist mask formed on the substrate 1, of the substrate 1 are removed from their top surfaces to bottom surfaces by a physico-chemical reaction to the generated plasma P, whereby the substrate 1 is divided into individual pieces. The steps from the fragmentation to the carrying-out of the divided substrate 1 may be the same as in the first embodiment.

Fourth Embodiment

The fourth embodiment relates to how the plasma processing apparatus 100 operates when the conveyance carrier 10 is separated from the stage 111. In the other points, the plasma processing apparatus 100 according to the fourth embodiment is the same as that according to the third embodiment. As in the third embodiment, for the sake of convenience, it is assumed that the conveyance carrier 10 is supported only by the support portions 122A and 122B.

How the plasma processing apparatus 100 operates will be described below with reference to FIGS. 14A to 14F. To facilitate understanding, the ESC electrodes 119 to which voltages are applied are hatched in FIGS. 14A to 14F.

Figure 14A:
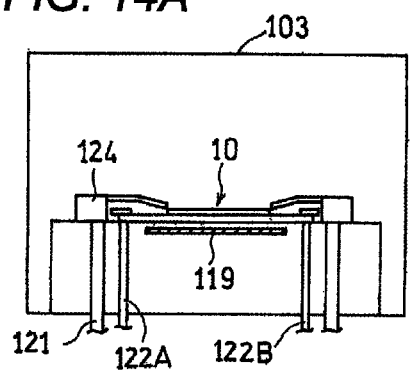
FIGS. 14A to 14F are conceptual diagrams showing an operation of the plasma processing apparatus according to a fourth embodiment of the invention.

FIG. 14A shows a state that the conveyance carrier 10 that has just been subjected to plasma processing is mounted on the stage 111. In this state, voltages are being applied to the ESC electrodes 119. The voltage application to the ESC electrodes 119 is stopped and then the cover 124 is elevated by driving the elevation rods 121 (see FIG. 14B, Ta=Tb=0). Either of the start of elevation of the cover 124 and the stop of voltage application may be made first.

Then elevation of the support portions 122A and 122B is started. As shown in FIG. 14C, first, the support portion 122A is elevated slightly (Ta>0, Tb=0). As a result, the conveyance carrier 10 comes to be supported by the support portions 122A and 122B in a state that it is inclined with respect to the stage 111. The inclination angle θu of the frame 2 at this time is not limited to any particular range and may be in the same range as the inclination angle θd. From the viewpoints of causing the holding sheet 3 to be separated from the stage 111 smoothly and preventing the holding sheet 3 from slipping down from the support portions 122A and 122B during its elevation, it is preferable that the inclination angle θu of the frame 2 be in a range of 0.01° to 5.0° and it is even preferable that the inclination angle θu be in a range of 0.1° to 2.0°. An inclination angle θu is determined in the same manner as an inclination angle θd.

Figure 14D:
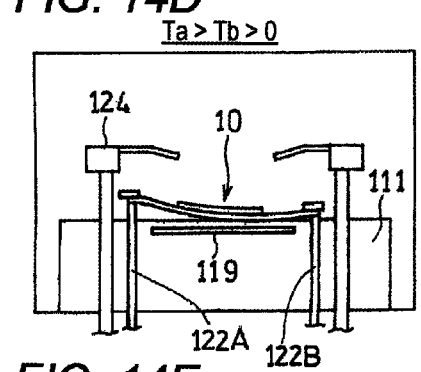
Figure 14B:
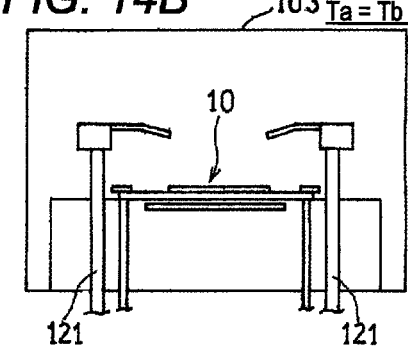
Figure 14E:
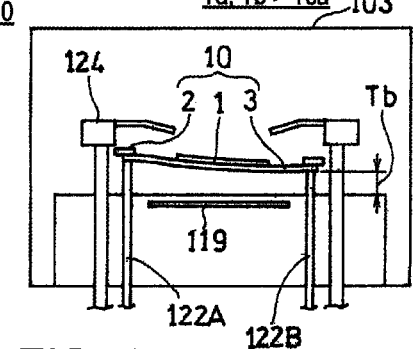
Figure 14C:
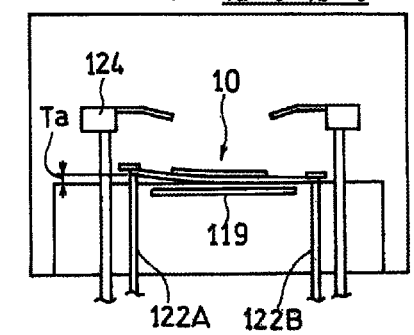
Figure 14F:
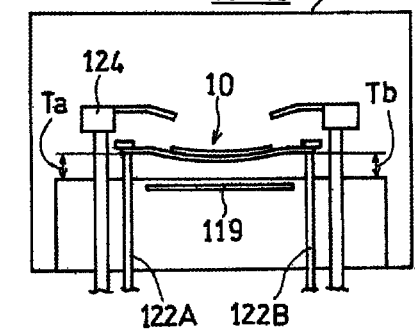

As shown in FIG. 14D, the support portions 122A and 122B are elevated with the frame 2 kept inclined with respect to the stage 111 (Ta>Tb>0). As a result, the holding sheet 3 is separated from the stage 111 gradually in the direction from the side closer to the support portion 122A to the side closer to the support portion 122B. Since, the holding sheet 3 is separated from the stage 111 gradually starting from its one end, the holding sheet 3 can be separated from the stage 111 smoothly.

The support portions 122A and 122B continue to be elevated. When the separation of the holding sheet 3 has been completed (Ta>Tb>Tca) and the top surface 122Aa of the support portion 122A reaches the prescribed position (see FIG. 14E), the elevation of the support portion 122A is stopped. On the other hand, the support portion 122B continues to ascend. When the top surface 122Ba of the support portion 122B has become in the same level as the top surface 122Aa of the support portion 122A (Ta=Tb), the elevation of the support portion 122B is stopped. Subsequently, the conveyance carrier 10 is transferred to the conveying mechanism (not shown) and carried out of the vacuum chamber 103.

The plasma processing apparatus according to one or more embodiments of the invention is useful as an apparatus for performing plasma processing on a substrate that is held by a conveyance carrier.

What is claimed is:

1. A plasma processing method for performing plasma processing on a substrate that is held by a conveyance carrier that is mounted on a stage that is disposed in a reaction chamber, the conveyance carrier comprising a holding sheet that holds the substrate and a frame that is attached to an outer circumferential portion of the holding sheet, the stage comprising therein an electrode portion of an electrostatic chuck mechanism and a heater, said plasma processing method comprising:

causing a support portion, which is capable of being elevated and lowered relative to the stage, to support the conveyance carrier at a transfer position that is distant from the stage upward;

mounting the conveyance carrier to a stage-mounted position on the stage by lowering the support portion;

applying a voltage to the electrode portion;

heating the stage by a heater; and generating plasma in the reaction chamber, wherein the voltage application to the electrode portion is started in a state that the stage is being heated, and wherein the plasma is generated after at least a part of the outer circumferential portion of the holding sheet contacts the stage and also after the heating of the stage is stopped.

2. A plasma processing method for performing plasma processing on a substrate that is held by a conveyance carrier that is mounted on a stage that is disposed in a reaction chamber, the conveyance carrier comprising a holding sheet that holds the substrate and a frame that is attached to an outer circumferential portion of the holding sheet, the stage comprising therein an electrode portion of an electrostatic chuck mechanism and a heater, said plasma processing method comprising:

stopping application of a voltage that has been applied to the electrode portion;

heating the stage by the heater;

causing a support portion, which is capable of being elevated and lowered relative to the stage, to support the conveyance carrier at a stage-mounted position on the stage; and separating the conveyance carrier from the stage by elevating the support portion after the application of the voltage is stopped,
wherein the support portion is elevated after a start of the heating of the stage.

3. A plasma processing method for performing plasma processing on a substrate that is held by a conveyance carrier that is mounted on a stage that is disposed in a reaction chamber, the conveyance carrier comprising a holding sheet that holds the substrate and a frame that is attached to an outer circumferential portion of the holding sheet, said plasma processing method comprising:
   causing a support portion, which is capable of being elevated and lowered relative to the stage, to support the conveyance carrier at a transfer position that is distant from the stage upward;
   mounting the conveyance carrier to a stage-mounted position on the stage by lowering the support portion; and
   applying a voltage to an electrode portion of an electrostatic chuck mechanism that is disposed inside the stage,
   wherein the support portion is lowered so that the holding sheet comes into contact with the stage in a state that the frame is inclined with respect to the stage.

4. The plasma processing method according to claim 3, wherein voltage application to the electrode portion is started before the contact of the outer circumferential portion of the holding sheet to the stage.

5. The plasma processing method according to claim 3, wherein an angle of inclination of the frame with respect to the stage when the holding sheet starts contacting the stage is from 0.01° to 5.0°.

6. A plasma processing method for performing plasma processing on a substrate that is held by a conveyance carrier that is mounted on a stage that is disposed in a reaction chamber, the conveyance carrier comprising a holding sheet that holds the substrate and a frame that is attached to an outer circumferential portion of the holding sheet, said plasma processing method comprising:
   causing a support portion capable of being elevated and lowered relative to the stage to support, at a stage-mounted position, the conveyance carrier being mounted on the stage; and
   separating the conveyance carrier from the stage in a state that the frame is inclined with respect to the stage by elevating the support portion.

7. The plasma processing method according to claim 6, wherein an angle of inclination of the frame with respect to the stage when the conveyance carrier starts being separated from the stage is from 0.01° to 5.0°.

* * * * *